(12) United States Patent
Kwon et al.

(10) Patent No.: US 11,598,858 B2
(45) Date of Patent: Mar. 7, 2023

(54) LIGHT DETECTOR, LIGHT DETECTION SYSTEM, LIDAR DEVICE, AND VEHICLE

(71) Applicant: KABUSHIKI KAISHA TOSHIBA, Minato-ku (JP)

(72) Inventors: Honam Kwon, Kawasaki (JP); Koichi Ishii, Kawasaki (JP); Ikuo Fujiwara, Yokohama (JP); Kazuhiro Suzuki, Meguro (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 432 days.

(21) Appl. No.: 16/812,435

(22) Filed: Mar. 9, 2020

(65) Prior Publication Data

US 2021/0063545 A1    Mar. 4, 2021

(30) Foreign Application Priority Data

Aug. 29, 2019   (JP) .............................. JP2019-157217

(51) Int. Cl.
| | |
|---|---|
| *G01S 7/4863* | (2020.01) |
| *G01S 17/931* | (2020.01) |
| *G01S 7/4865* | (2020.01) |
| *H01L 31/02* | (2006.01) |

(52) U.S. Cl.
CPC .......... *G01S 7/4863* (2013.01); *G01S 7/4865* (2013.01); *G01S 17/931* (2020.01); *H01L 31/02005* (2013.01)

(58) Field of Classification Search
CPC .... G01S 7/4863; G01S 7/4865; G01S 17/931; H01L 31/02005
See application file for complete search history.

(56) References Cited

U.S. PATENT DOCUMENTS

| | | | | |
|---|---|---|---|---|
| 6,133,615 | A | * | 10/2000 | Guckel ............. H01L 27/14601 257/466 |
| 2004/0190377 | A1 | | 9/2004 | Lewandowski et al. |
| 2005/0212071 | A1 | | 9/2005 | Yue et al. |
| 2008/0308738 | A1 | | 12/2008 | Li et al. |

(Continued)

FOREIGN PATENT DOCUMENTS

| | | |
|---|---|---|
| JP | 1-205566 A | 8/1989 |
| JP | 2005-295553 A | 10/2005 |

(Continued)

*Primary Examiner* — Thanh Luu
(74) *Attorney, Agent, or Firm* — Oblon, McClelland, Maier & Neustadt, L.L.P.

(57) ABSTRACT

According to one embodiment, a light detector includes a conductive layer, a first element, a second element, a first member, a first insulating part, and a second insulating part. The conductive layer includes a first conductive portion and a second conductive portion. The first element includes a first semiconductor layer and a second semiconductor layer. The second element includes a fourth semiconductor layer and a fifth semiconductor layer. The first member is provided between the first element and the second element and electrically connected to the conductive layer. The first member is conductive. The first insulating part is provided between the first element and the first member. The second insulating part is provided between the second element and the first member.

19 Claims, 13 Drawing Sheets

(56) References Cited

U.S. PATENT DOCUMENTS

| | | | |
|---|---|---|---|
| 2009/0184317 A1* | 7/2009 | Sanfilippo | H01L 27/14658 |
| | | | 257/E31.116 |
| 2010/0155867 A1 | 6/2010 | Arai | |
| 2011/0272561 A1 | 11/2011 | Sanfilippo et al. | |
| 2014/0167145 A1 | 6/2014 | Ichinoseki | |
| 2020/0025934 A1 | 1/2020 | Kwon et al. | |
| 2021/0132230 A1 | 5/2021 | Fujiwara et al. | |
| 2021/0273120 A1* | 9/2021 | Zang | H01L 31/02327 |

FOREIGN PATENT DOCUMENTS

| | | |
|---|---|---|
| JP | 2007-80905 A | 3/2007 |
| JP | 2007-531281 A | 11/2007 |
| JP | 2008-311651 A | 12/2008 |
| JP | 2010-103316 A | 5/2010 |
| JP | 2017-163046 A | 9/2017 |
| JP | 2018-201005 A | 12/2018 |
| JP | 2020-13950 A | 1/2020 |
| JP | 2021-72347 A | 5/2021 |

* cited by examiner

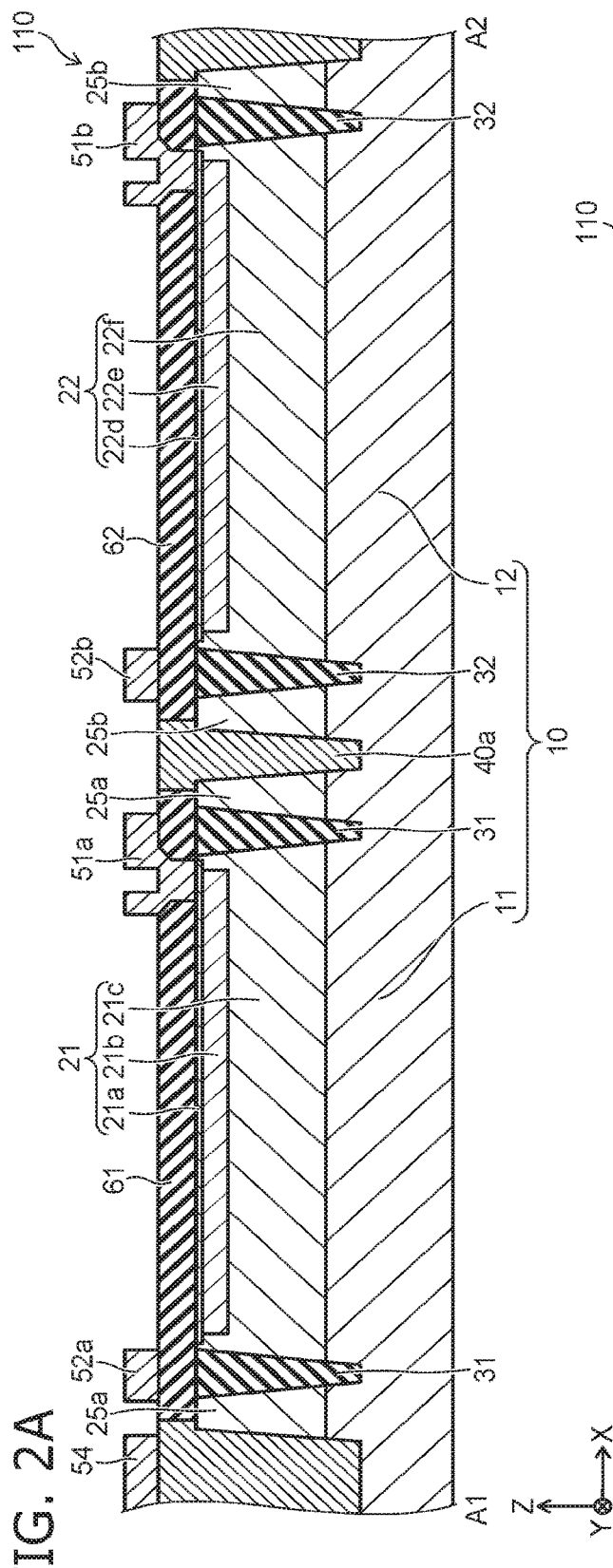
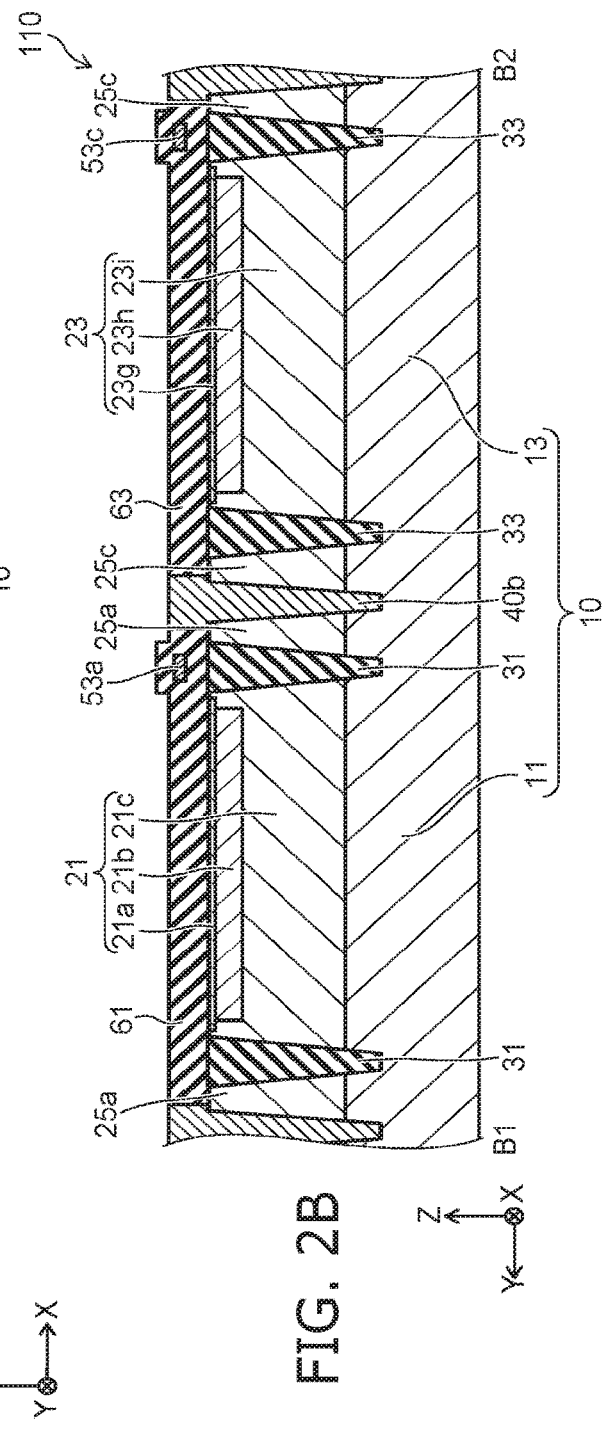

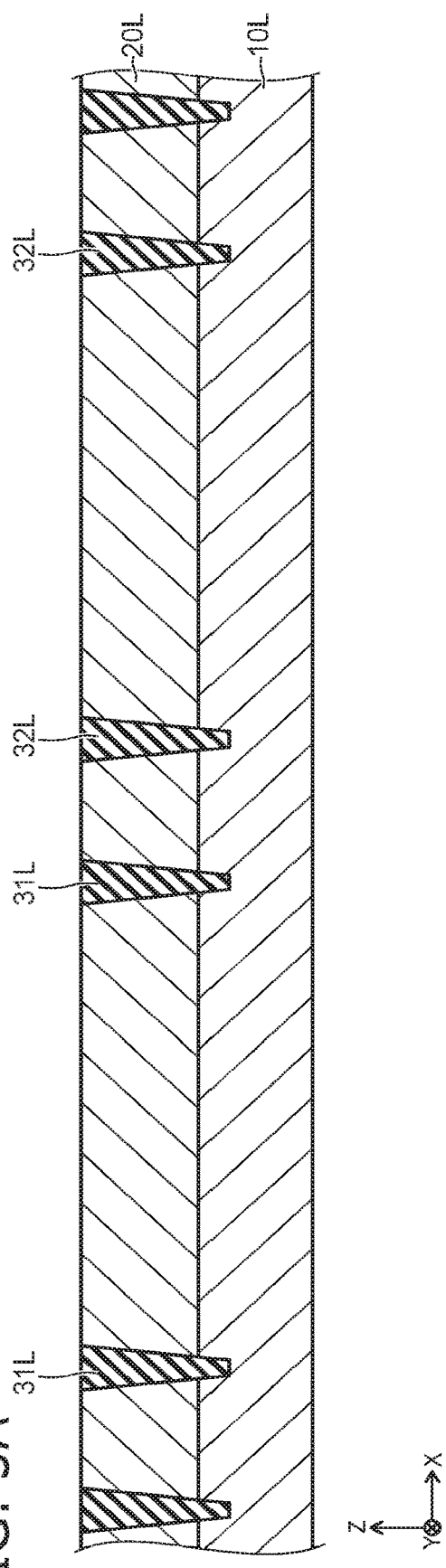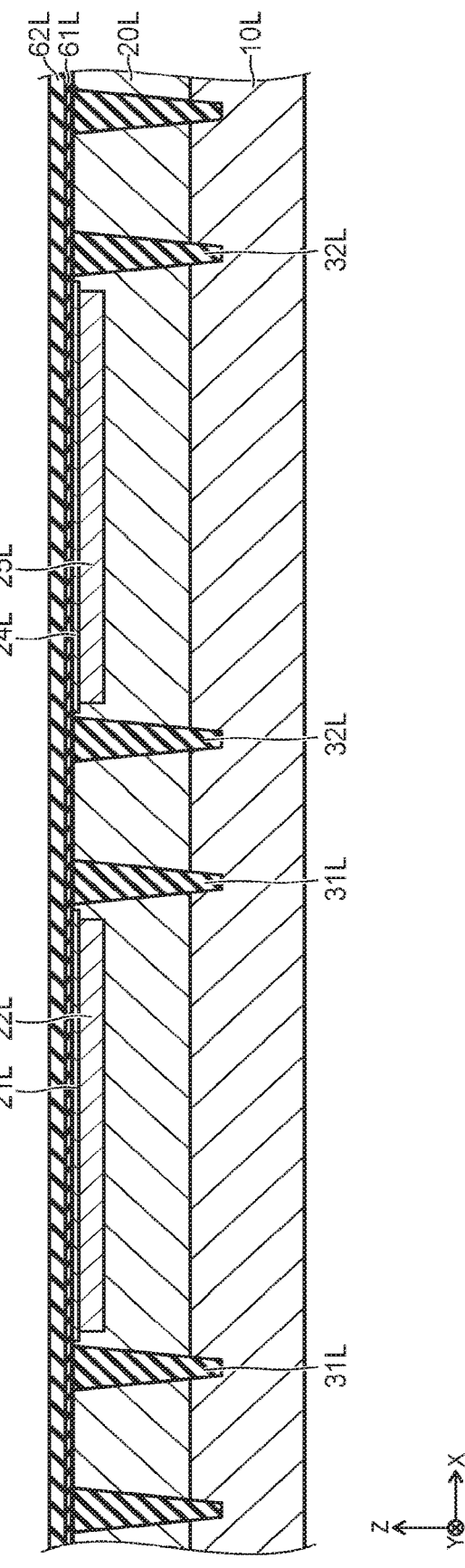

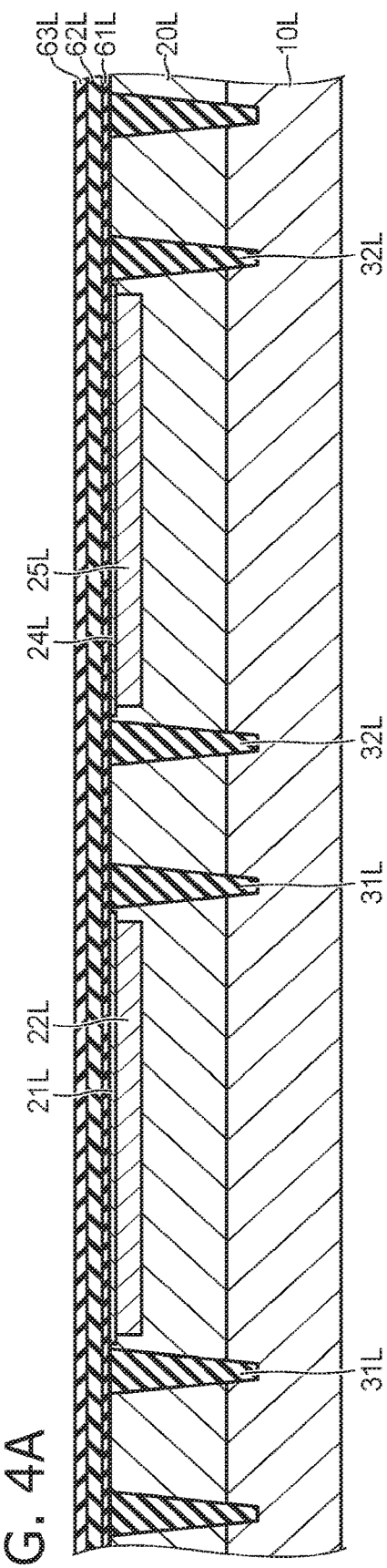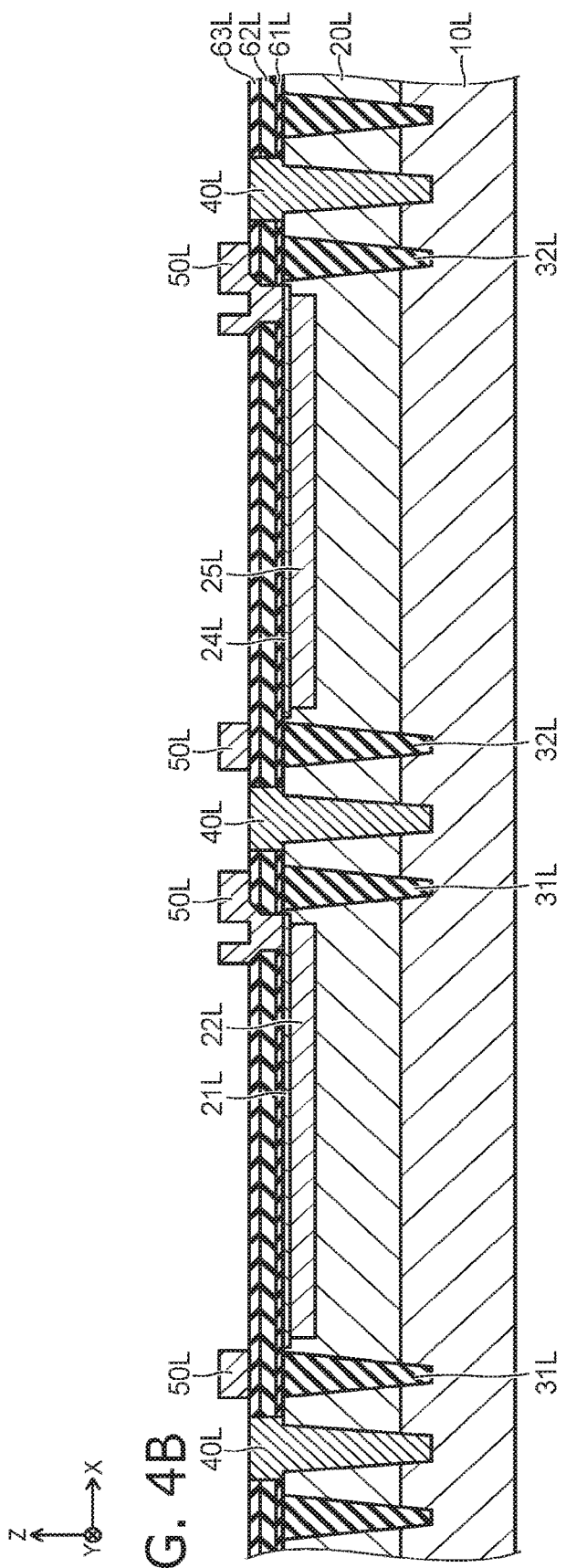

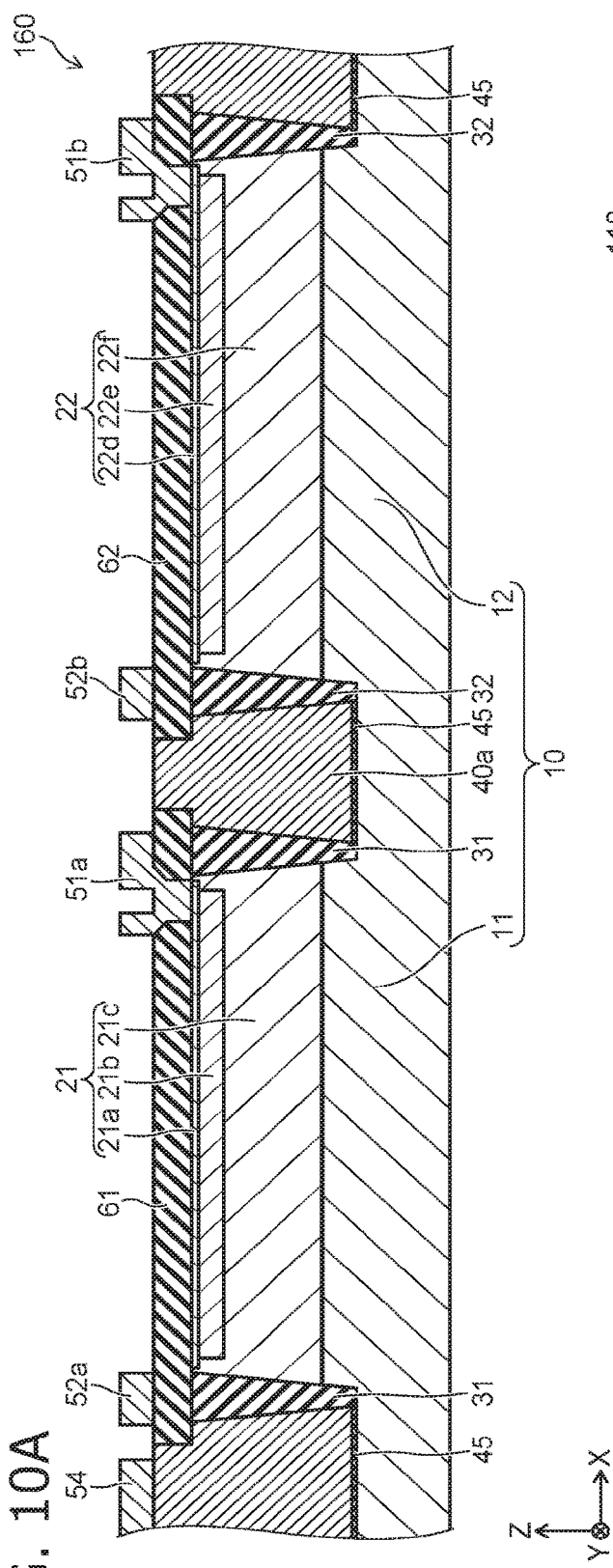
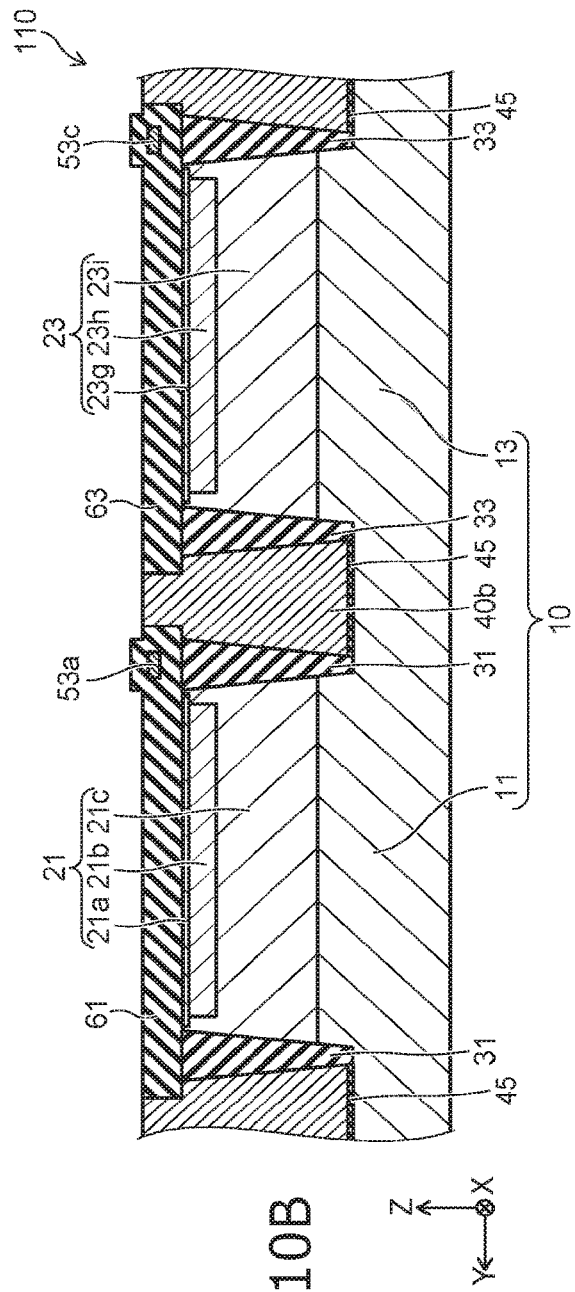

LIGHT DETECTOR, LIGHT DETECTION SYSTEM, LIDAR DEVICE, AND VEHICLE

CROSS-REFERENCE TO RELATED APPLICATIONS

This application is based upon and claims the benefit of priority from Japanese Patent Application No. 2019-157217, filed on Aug. 29, 2019; the entire contents of which are incorporated herein by reference.

FIELD

Embodiments described herein relate generally to a light detector, a light detection system, a lidar device, and a vehicle.

BACKGROUND

A light detector detects light incident on an element including a semiconductor. It is desirable to increase the performance of the light detector.

BRIEF DESCRIPTION OF THE DRAWINGS

FIG. 2A and FIG. 2B are schematic cross-sectional views illustrating the light detector according to the first embodiment;

FIG. 3A, FIG. 3B, FIG. 4A, and FIG. 4B are schematic cross-sectional views illustrating manufacturing processes of the light detector according to the first embodiment;

FIG. 10A and FIG. 10B are schematic cross-sectional views illustrating a light detector according to a sixth embodiment;

DETAILED DESCRIPTION

Figure 1:
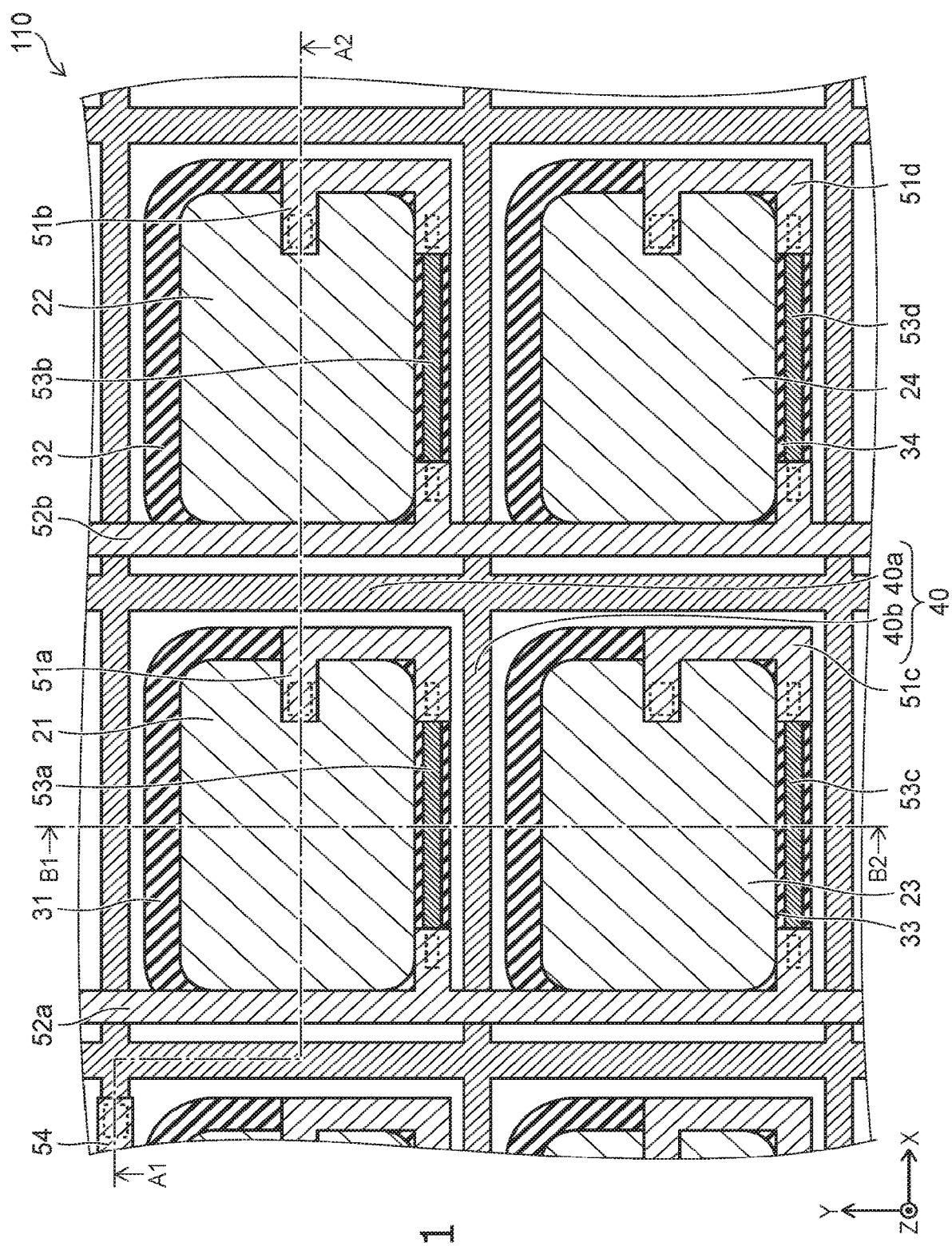
FIG. 1 is a schematic plan view illustrating a light detector according to a first embodiment.

According to one embodiment, a light detector includes a conductive layer, a first element, a second element, a first member, a first insulating part, and a second insulating part. The conductive layer includes a first conductive portion and a second conductive portion. The first element includes a first semiconductor layer and a second semiconductor layer. The first semiconductor layer is of a first conductivity type. The second semiconductor layer is of a second conductivity type and is provided between the first conductive portion and the first semiconductor layer in a second direction crossing a first direction. The first direction is from the first conductive portion toward the second conductive portion. The second element includes a fourth semiconductor layer and a fifth semiconductor layer. The fourth semiconductor layer is of the first conductivity type. The fifth semiconductor layer is of the second conductivity type and is provided between the second conductive portion and the fourth semiconductor layer in the second direction. The first member is provided between the first element and the second element and electrically connected to the conductive layer. The first member is conductive. The first insulating part is provided between the first element and the first member. The second insulating part is provided between the second element and the first member.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

First Embodiment

FIG. 1 is a schematic plan view illustrating a light detector according to a first embodiment.

FIG. 2A and FIG. 2B are schematic cross-sectional views illustrating the light detector according to the first embodiment.

FIG. 2A is an A1-A2 cross section of FIG. 1. FIG. 2B is a B1-B2 cross section of FIG. 1.

As shown in FIG. 1 and FIG. 2A, the light detector 110 according to the first embodiment includes a conductive layer 10, a first element 21, a second element 22, a first insulating part 31, a second insulating part 32, and a conductor 40. The first insulating part 31 surrounds the first element 21. The second insulating part 32 surrounds the second element 22. The conductor 40 surrounds the first insulating part 31 and the second insulating part 32. The first element 21, the second element 22, the first insulating part 31, the second insulating part 32, and the conductor 40 are provided on the conductive layer 10. Herein, the direction from the back toward the front in the page surface of FIG. 1 is taken as "up".

Carriers are generated in the first element 21 when light is incident on the first element 21. Similarly, carriers are generated in the second element 22 when light is incident on the second element 22. The light detector 110 detects the light incident on the elements as electrical signals.

The conductive layer 10 includes a first conductive portion 11 and a second conductive portion 12. The direction from the first conductive portion 11 toward the second conductive portion 12 is taken as a first direction. For example, the first direction is along an X-direction shown in FIG. 1. One direction perpendicular to the X-direction is taken as a Y-direction. A direction perpendicular to the X-direction and the Y-direction is taken as a Z-direction. A direction that crosses the first direction is taken as a second direction. For example, the second direction is along the Z-direction. A direction crossing a plane parallel to the first direction and the second direction is taken as a third direction. For example, the third direction is along the Y-direction. Hereinbelow, a case will be described where the first direction, the second direction, and the third direction are respectively along the X-direction, the Z-direction, and the Y-direction.

The first element 21 includes a first semiconductor layer 21a of a first conductivity type, a second semiconductor layer 21b of a second conductivity type, and a third semiconductor layer 21c of the second conductivity type. The first semiconductor layer 21a, the second semiconductor layer 21b, and the third semiconductor layer 21c spread along the X-direction and the Y-direction. The second semiconductor layer 21b and the third semiconductor layer 21c are provided between the first semiconductor layer 21a and the first conductive portion 11. The first semiconductor layer 21a is separated from the first conductive portion 11 in the Z-direction. The second semiconductor layer 21b is provided between the first conductive portion 11 and the first semiconductor layer 21a in the Z-direction. The third semiconductor layer 21c is provided between the first conductive portion 11 and the second semiconductor layer 21b in the Z-direction and surrounds the first semiconductor layer 21a and the second semiconductor layer 21b along the X-Y plane. For example, the third semiconductor layer 21c contacts the first conductive portion 11. The first semiconductor layer 21a, the second semiconductor layer 21b, and the third semiconductor layer 21c are electrically connected to the first conductive portion 11.

The second element 22 includes a fourth semiconductor layer 22d of the first conductivity type, a fifth semiconductor layer 22e of the second conductivity type, and a sixth semiconductor layer 22f of the second conductivity type. The fourth semiconductor layer 22d, the fifth semiconductor layer 22e, and the sixth semiconductor layer 22f spread along the X-direction and the Y-direction. The fifth semiconductor layer 22e and the sixth semiconductor layer 22f are provided between the fourth semiconductor layer 22d and the second conductive portion 12 in the Z-direction. The fourth semiconductor layer 22d is separated from the second conductive portion 12 in the Z-direction. The fifth semiconductor layer 22e is provided between the second conductive portion 12 and the fourth semiconductor layer 22d in the Z-direction. The sixth semiconductor layer 22f is provided between the first conductive portion 11 and the fifth semiconductor layer 22e in the Z-direction and surrounds the fourth semiconductor layer 22d and the fifth semiconductor layer 22e along the X-Y plane. For example, the sixth semiconductor layer 22f contacts the second conductive portion 12. The fourth semiconductor layer 22d, the fifth semiconductor layer 22e, and the sixth semiconductor layer 22f are electrically connected to the second conductive portion 12.

The conductive layer 10 spreads along the X-direction and the Y-direction and is arranged in the Z-direction with the first element 21 and the second element 22. For example, the potential of the conductive layer 10 is controlled via the conductor 40 described below. Also, the potential of the second semiconductor layer 21b and the potential of the fifth semiconductor layer 22e can be controlled by controlling the potential of the conductive layer 10. By controlling the potential of the second semiconductor layer 21b and the potential of the fifth semiconductor layer 22e, voltages are applied between the first semiconductor layer 21a and the second semiconductor layer 21b and between the fourth semiconductor layer 22d and the fifth semiconductor layer 22e. For example, the first element 21 and the second element 22 function as avalanche photodiodes.

For example, the first conductivity type is an n-type; and the second conductivity type is a p-type. The first conductivity type may be the p-type; and the second conductivity type may be the n-type. The impurity concentration of the second conductivity type in the third semiconductor layer 21c is lower than the impurity concentration of the second conductivity type in the second semiconductor layer 21b. Thereby, carriers that are generated in the third semiconductor layer 21c move into the second semiconductor layer 21b and undergo avalanche multiplication. The impurity concentration of the second conductivity type in the sixth semiconductor layer 22f is lower than the impurity concentration of the second conductivity type in the fifth semiconductor layer 22e. Thereby, carriers that are generated in the sixth semiconductor layer 22f move easily into the fifth semiconductor layer 22e; and crosstalk can be reduced.

The direction from the first element 21 toward the second element 22 is along the X-direction. For example, the direction from the first semiconductor layer 21a toward the fourth semiconductor layer 22d is along the X-direction. The direction from the second semiconductor layer 21b toward the fifth semiconductor layer 22e is along the X-direction. The direction from the third semiconductor layer 21c toward the sixth semiconductor layer 22f is along the X-direction.

The conductor 40 is provided around the first element 21 and the second element 22 along the X-Y plane. In other words, the conductor 40 surrounds the first element 21 and the second element 22. In the example shown in FIG. 1, FIG. 2A, and FIG. 2B, one unbroken conductor 40 is provided to be continuous around the first element 21 and the second element 22. The configuration is not limited to the example; multiple conductors 40 may be arranged to be separated from each other around the first element 21 and the second element 22; and the first element 21 and the second element 22 may be surrounded with the multiple conductors 40. However, to reduce the crosstalk and reduce the resistance of the conductor 40, it is favorable for the first element 21 and the second element 22 to be surrounded continuously with one conductor 40.

Herein, "surround" includes not only the case where an unbroken component continuously surrounds another component, but also includes the case where multiple components are separated from each other and arranged around the other component. For example, the other component can be considered to be surrounded with the multiple components when the other component is positioned inside a path obtained by tracing along the multiple components.

It is favorable for the length in the Z-direction of the conductor 40 to be longer than the length in the Z-direction of the first element 21 and longer than the length in the Z-direction of the second element 22. The length in the Z-direction of the conductor 40 is greater than the thicknesses in the Z-direction of the first semiconductor layer 21a, the second semiconductor layer 21b, and the third semiconductor layer 21c. The conductor 40 contacts the conductive layer 10. A portion of the conductor 40 may pierce the conductive layer 10. The entire first element 21 and the entire second element 22 are covered with the conductor 40 in the X-direction and the Y-direction. In other words, the entire first element 21 and the entire second element 22 overlap the conductor 40 when viewed from the X-direction and from the Y-direction.

The conductor 40 includes a first member 40a positioned between the first element 21 and the second element 22 in the X-direction. The first insulating part 31 is provided between the first element 21 and the first member 40a in the X-direction. For example, the first insulating part 31 is provided around the first element 21 along the X-Y plane. In other words, the first insulating part 31 surrounds the first element 21. Multiple first insulating parts 31 may be arranged around the first element 21; and the first element 21 may be surrounded with the multiple first insulating parts 31.

The second insulating part 32 is provided between the second element 22 and the first member 40a in the X-direction. For example, the second insulating part 32 is provided around the second element 22 along the X-Y plane. In other words, the second insulating part 32 surrounds the second element 22. Multiple second insulating parts 32 may be arranged around the second element 22; and the second element 22 may be surrounded with the multiple second insulating parts 32.

For example, the first insulating part 31 and the second insulating part 32 contact the conductive layer 10. Because the first insulating part 31 and the second insulating part 32 contact the conductive layer 10, it is possible to reduce the crosstalk and reduce the leakage current between the conductor 40 and the elements.

A semiconductor part 25a is provided between the first insulating part 31 and the first member 40a in the X-direction. A semiconductor part 25b is provided between the second insulating part 32 and the first member 40a in the X-direction. For example, the semiconductor parts 25a and 25b are of the second conductivity type.

The light detector 110 illustrated in FIG. 1, FIG. 2A, and FIG. 2B further includes a third element 23, a fourth element 24, a third insulating part 33, a fourth insulating part 34, first to fourth wiring parts 51a to 51d, a first connection wiring part 52a, a second connection wiring part 52b, first to fourth conductive parts 53a to 53d, a wiring part 54, and first to third insulating regions 61 to 63. The first to third insulating regions 61 to 63 are not illustrated in FIG. 1. In FIG. 1, the regions shown by broken lines show the regions where the first element 21, the second element 22, the third element 23, the fourth element 24, the conductor 40, the first to fourth wiring parts 51a to 51d, the first connection wiring part 52a, the second connection wiring part 52b, the first to fourth conductive parts 53a to 53d, and the wiring part 54 contact each other.

As shown in FIG. 2B, the conductive layer 10 further includes a third conductive portion 13. The direction from the first conductive portion 11 toward the third conductive portion 13 is along the Y-direction.

The third element 23 includes a seventh semiconductor layer 23g of the first conductivity type, an eighth semiconductor layer 23h of the second conductivity type, and a ninth semiconductor layer 23i of the second conductivity type. The seventh semiconductor layer 23g is separated from the third conductive portion 13 in the Z-direction. The eighth semiconductor layer 23h is provided between the third conductive portion 13 and the seventh semiconductor layer 23g in the Z-direction. The ninth semiconductor layer 23i is provided between the third conductive portion 13 and the eighth semiconductor layer 23h in the Z-direction and surrounds the seventh semiconductor layer 23g and the eighth semiconductor layer 23h along the X-Y plane. The impurity concentration of the second conductivity type in the ninth semiconductor layer 23i is lower than the impurity concentration of the second conductivity type in the eighth semiconductor layer 23h. For example, the third element 23 contacts the third conductive portion 13.

The conductor 40 further includes a second member 40b positioned between the first element 21 and the third element 23 in the Y-direction. A portion of the first insulating part 31 is provided between the first element 21 and the second member 40b in the Y-direction. The third insulating part 33 is provided between the third element 23 and the second member 40b in the Y-direction. For example, the third insulating part 33 is provided around the third element 23 along the X-Y plane. For example, a portion of the third insulating part 33 is provided between the first conductive portion 11 and the third conductive portion 13 in the Y-direction.

The semiconductor part 25a is provided between the first insulating part 31 and the second member 40b in the Y-direction. A semiconductor part 25c is provided between the third insulating part 33 and the second member 40b in the Y-direction. For example, the semiconductor part 25c is of the second conductivity type.

The direction from the second element 22 toward the fourth element 24 is along the Y-direction. The direction from the third element 23 toward the fourth element 24 is along the X-direction. The fourth insulating part 34 is provided around the fourth element 24 along the X-Y plane. The structure of the fourth element 24 is, for example, the same as the structure of the first element 21.

The first wiring part 51a is electrically connected to the first semiconductor layer 21a. The second wiring part 51b is electrically connected to the fourth semiconductor layer 22d. The third wiring part 51c is electrically connected to the seventh semiconductor layer 23g. The fourth wiring part 51d is electrically connected to the semiconductor layer of the first conductivity type of the fourth element 24.

As shown in FIG. 1 and FIG. 2A, in the Z-direction, the first element 21 and the first insulating part 31 are provided between the first conductive portion 11 and the first wiring part 51a, between the first conductive portion 11 and the first insulating region 61, and between the first conductive portion 11 and the first connection wiring part 52a. In the Z-direction, the second element 22 and the second insulating part 32 are provided between the second conductive portion 12 and the second wiring part 51b, between the second conductive portion 12 and the second insulating region 62, and between the second conductive portion 12 and the second connection wiring part 52b. As shown in FIG. 1 and FIG. 2B, in the Z-direction, the third element 23 and the third insulating part 33 are provided between the third conductive portion 13 and the third wiring part 51c, between the third conductive portion 13 and the third insulating region 63, and between the third conductive portion 13 and the first connection wiring part 52a.

The first conductive part 53a is connected between the first connection wiring part 52a and the first wiring part 51a. The second conductive part 53b is connected between the second connection wiring part 52b and the second wiring part 51b. The third conductive part 53c is connected between the first connection wiring part 52a and the third wiring part 51c. The fourth conductive part 53d is connected between the second connection wiring part 52b and the fourth wiring part 51d. The electrical resistances of the first to fourth conductive parts 53a to 53d each are higher than the electrical resistances of the wiring parts and higher than the electrical resistances of the connection wiring parts. For example, the first to fourth conductive parts 53a to 53d function as quenching resistances. For example, it is favorable for the electrical resistances of the first to fourth conductive parts 53a to 53d each to be not less than 50 kΩ and not more than 2 MΩ.

The first to fourth wiring parts 51a to 51d, the first connection wiring part 52a, the second connection wiring part 52b, and the first to fourth conductive parts 53a to 53d are electrically isolated from the conductor 40. For example, as shown in FIG. 2A, a portion of the first insulating region 61 is provided between the conductor 40 and the first connection wiring part 52a.

The conductor 40 is electrically connected to the wiring part 54. The position where the conductor 40 and the wiring part 54 are connected is arbitrary. The direction from the wiring part 54 toward one of the first to fourth wiring parts 51a to 51d is along a direction parallel to the X-Y plane.

Examples of the materials of the components are described below.

The first to fourth elements 21 to 24 include silicon. When the first to fourth elements 21 to 24 include silicon, at least one selected from the group consisting of arsenic, phosphorus, and antimony may be used as the impurity of the first conductivity type. Boron may be used as the impurity of the second conductivity type.

The semiconductor parts 25a, 25b, and 25c include, for example, silicon and boron. The materials of the semiconductor parts 25a, 25b, and 25c may be the same or may be different from each other.

The impurity concentrations of the semiconductor layers are, for example, as follows.

The impurity concentration of the first conductivity type is not less than $1.0 \times 10^{18}$ atoms/cm$^3$ and not more than $1.0 \times 10^{21}$ atoms/cm$^3$ for the first semiconductor layer 21a, the fourth semiconductor layer 22d, and the seventh semiconductor layer 23g. By setting this concentration range, the electrical resistances of the first semiconductor layer 21a, the fourth semiconductor layer 22d, and the seventh semiconductor layer 23g can be reduced; and the carrier loss in these semiconductor layers can be reduced.

The impurity concentration of the second conductivity type is not less than $1.0 \times 10^{16}$ atoms/cm$^3$ and not more than $1.0 \times 10^{18}$ atoms/cm$^3$ for the second semiconductor layer 21b, the fifth semiconductor layer 22e, and the eighth semiconductor layer 23h. By setting this concentration range, the second semiconductor layer 21b, the fifth semiconductor layer 22e, and the eighth semiconductor layer 23h can have p-n junctions respectively with the first semiconductor layer 21a, the fourth semiconductor layer 22d, and the seventh semiconductor layer 23g; and depletion layers can spread easily in the second semiconductor layer 21b, the fifth semiconductor layer 22e, and the eighth semiconductor layer 23h.

The impurity concentration of the second conductivity type is not less than $1.0 \times 10^{13}$ atoms/cm$^3$ and not more than $1.0 \times 10^{16}$ atoms/cm$^3$ for the third semiconductor layer 21c, the sixth semiconductor layer 22f, and the ninth semiconductor layer 23i. By setting this concentration range, depletion layers can spread sufficiently in the third semiconductor layer 21c, the sixth semiconductor layer 22f, and the ninth semiconductor layer 23i; and the light detection efficiency or the light-receiving sensitivity can be increased.

The conductive layer 10 is a semiconductor layer of the second conductivity type. The impurity concentration of the second conductivity type in the conductive layer 10 is not less than $1.0 \times 10^{17}$ atoms/cm$^3$ and not more than $1.0 \times 10^{21}$ atoms/cm$^3$. The conductive layer 10 may include a metal.

For example, the conductive layer 10 includes at least one selected from the group consisting of aluminum, copper, titanium, gold, and nickel.

The first to fourth insulating parts 31 to 34 include at least one selected from the group consisting of silicon, oxygen, and nitrogen.

The first to fourth wiring parts 51a to 51d, the first connection wiring part 52a, the second connection wiring part 52b, and the wiring part 54 include at least one selected from the group consisting of aluminum and copper. The first to fourth wiring parts 51a to 51d, the first connection wiring part 52a, the second connection wiring part 52b, and the wiring part 54 may include an aluminum compound.

The first to fourth conductive parts 53a to 53d include polysilicon. The first to fourth conductive parts 53a to 53d may further include an impurity of the first conductivity type or the second conductivity type.

The first to third insulating regions 61 to 63 include at least one selected from the group consisting of silicon, oxygen, and nitrogen. The first to third insulating regions 61 to 63 each may include multiple layers. For example, the first to third insulating regions 61 to 63 each include a layer including silicon oxide, a layer including silicon oxide, boron, and phosphorus, and a layer including silicon oxide.

The conductor 40 includes, for example, at least one selected from the group consisting of tungsten, polysilicon, aluminum, copper, nickel, titanium, and chrome. The conductor 40 can be provided with conductivity thereby. The conductor 40 may include an alloy including aluminum and copper.

Or, the conductor 40 includes at least one selected from the group consisting of tungsten, aluminum, copper, nickel, titanium, and chrome. Thereby, the light transmittance of the conductor 40 can be lower than the light transmittance of the third semiconductor layer 21c and lower than the light transmittance of the sixth semiconductor layer 22f.

Favorably, the conductor 40 includes at least one selected from the group consisting of tungsten, aluminum, and copper. Thereby, the conductor 40 can be provided with conductivity; and the light transmittance of the conductor 40 can be lower than the light transmittances of the semiconductor layers.

Examples of the lengths of the components will now be described.

The thicknesses in the Z-direction of the first semiconductor layer 21a, the fourth semiconductor layer 22d, and the seventh semiconductor layer 23g are not less than 10 nm and not more than 2000 nm.

The second semiconductor layer 21b, the fifth semiconductor layer 22e, and the eighth semiconductor layer 23h are positioned respectively at the lower portions of the first semiconductor layer 21a, the fourth semiconductor layer 22d, and the seventh semiconductor layer 23g. The thicknesses in the Z-direction of the second semiconductor layer 21b, the fifth semiconductor layer 22e, and the eighth semiconductor layer 23h are not less than 10 nm and not more than 5000 nm.

The thickness in the Z-direction of the third semiconductor layer 21c is thicker than the total of the thickness in the Z-direction of the first semiconductor layer 21a and the thickness in the Z-direction of the second semiconductor layer 21b and is 15 μm or less. The thickness in the Z-direction of the sixth semiconductor layer 22f is thicker than the total of the thickness in the Z-direction of the fourth semiconductor layer 22d and the thickness in the Z-direction of the fifth semiconductor layer 22e and is 15 μm or less. The thickness in the Z-direction of the ninth semiconductor layer 23i is thicker than the total of the thickness in the Z-direction of the seventh semiconductor layer 23g and the thickness in the Z-direction of the eighth semiconductor layer 23h and is 15 µm or less.

The length in the Z-direction of the first insulating part 31 is longer than the total of the thickness in the Z-direction of the first semiconductor layer 21a and the thickness in the Z-direction of the second semiconductor layer 21b and is 20 µm or less.

The length in the Z-direction of the second insulating part 32 is longer than the total of the thickness in the Z-direction of the fourth semiconductor layer 22d and the thickness in the Z-direction of the fifth semiconductor layer 22e and is 20 µm or less.

The length in the Z-direction of the third insulating part 33 is longer than the total of the thickness in the Z-direction of the seventh semiconductor layer 23g and the thickness in the Z-direction of the eighth semiconductor layer 23h and is 20 µm or less.

For example, the thicknesses in the Z-direction of the first semiconductor layer 21a, the fourth semiconductor layer 22d, and the seventh semiconductor layer 23g each are taken as T1. The thicknesses in the Z-direction of the second semiconductor layer 21b, the fifth semiconductor layer 22e, and the eighth semiconductor layer 23h each are taken as T2. The thicknesses in the Z-direction of the third semiconductor layer 21c, the sixth semiconductor layer 22f, and the ninth semiconductor layer 23i each are taken as T3. The lengths in the Z-direction of the first insulating part 31, the second insulating part 32, and the third insulating part 33 each are taken as L1. In such a case, it is favorable for the relationships of the following Formula (1) and Formula (2) to be satisfied.

$$T1+1.1 \times T2 < L1 \tag{1}$$

$$L1 < T1+T2+1.1 \times T3 \tag{2}$$

By setting the length L1 to satisfy Formula (1), the flow toward the conductor 40 of the carriers generated at each p-n junction surface can be suppressed sufficiently. By setting the length L1 to satisfy Formula (2), the formation of the first to third insulating parts 31 to 33 is easy. Therefore, the yield of the light detector 110 can be increased.

However, when the thickness T2 is greater than 10 times the thickness T3, it is favorable for the relationships of the following Formula (3) and Formula (4) to be satisfied.

$$T1+1.1 \times T2 < L1 \tag{3}$$

$$T1+T2+1.1 \times T3 < L1 \tag{4}$$

By setting the length L1 to satisfy Formula (3) and Formula (4), the yield of the light detector 110 can be increased while suppressing the flow toward the conductor 40 of the carriers generated at each p-n junction surface.

It is favorable for the lengths in the Z-direction of the first member 40a and the second member 40b each to be greater than the thicknesses in the Z-direction of the third semiconductor layer 21c, the sixth semiconductor layer 22f, and the ninth semiconductor layer 23i. The crosstalk can be reduced thereby. On the other hand, it is favorable for the lengths in the Z-direction of the first member 40a and the second member 40b each to be 20 µm or less to make the patterning of these members easy.

It is favorable for the distance in the X-direction between the first insulating part 31 and the second insulating part 32 to be 10 µm or less. Thereby, the surface area in the X-Y plane of the first element 21 and the second element 22 can be large; and the light detection efficiency can be increased. On the other hand, if the distance is too short, it is difficult to provide the first member 40a. Therefore, it is favorable for the distance in the X-direction between the first insulating part 31 and the second insulating part 32 to be 0.5 µm or more.

It is favorable for the side surfaces of the first insulating part 31, the second insulating part 32, the first member 40a, and the second member 40b each to be oblique to the Z-direction. In other words, it is favorable for the widths of the first insulating part 31, the second insulating part 32, the first member 40a, and the second member 40b to decrease toward the conductive layer 10. According to such configurations, it is easy to fill the insulating material or the conductive material when forming the first insulating part 31, the second insulating part 32, the first member 40a, and the second member 40b. Therefore, the yield of the light detector 110 can be increased.

FIG. 3A, FIG. 3B, FIG. 4A, and FIG. 4B are schematic cross-sectional views illustrating manufacturing processes of the light detector according to the first embodiment.

A semiconductor layer 20L of the second conductivity type is formed on a semiconductor layer 10L of the second conductivity type. For example, the semiconductor layer 20L is formed by epitaxial growth of silicon. Multiple trenches that pierce the semiconductor layer 20L are formed. For example, the trenches are formed by reactive ion etching (RIE). Each of the trenches surrounds a portion of the semiconductor layer 20L. Insulating layers are formed in the trenches. For example, the insulating layers are formed by chemical vapor deposition (CVD) using tetraethoxysilane. As shown in FIG. 3A, an insulating layer 31L and an insulating layer 32L are formed thereby. Heat treatment of the semiconductor layer 20L may be performed when forming the insulating layers. The defects of the semiconductor layer 20L occurring when the trenches are formed can be repaired thereby.

A semiconductor layer of the first conductivity type and a semiconductor layer of the second conductivity type are formed in the portion of the semiconductor layer 20L surrounded with the insulating layer by sequentially ion-implanting an impurity of the first conductivity type and an impurity of the second conductivity type. For example, a semiconductor layer 21L of the first conductivity type and a semiconductor layer 22L of the second conductivity type are formed inside the insulating layer 31L. A semiconductor layer 24L of the first conductivity type and a semiconductor layer 25L of the second conductivity type are formed inside the insulating layer 32L. An insulating layer 61L which covers the semiconductor layer 20L is formed by CVD. As shown in FIG. 3B, an insulating layer 62L is formed on the insulating layer 61L. For example, the insulating layer 61L includes silicon oxide. The insulating layer 62L includes silicon oxide, boron, and phosphorus.

After melting the insulating layer 62L, the melted insulating layer 62L is caused to solidify. The flatness of the surface of the insulating layer 62L improves thereby. A not-illustrated polysilicon layer is formed on the insulating layer 62L; and the polysilicon layer is patterned. The conductive layers that correspond to the quenching resistances are formed thereby. As shown in FIG. 4A, an insulating layer 63L is formed by CVD on the insulating layer 62L and the conductive layer. The insulating layer 63L includes, for example, silicon oxide.

A trench is formed between the insulating layers piercing the semiconductor layer 20L. The trench reaches the semiconductor layer 10L. A metal layer 40L is formed in the trench by CVD. The metal layer 40L includes, for example, tungsten. Then, openings are formed by removing a portion of the insulating layer 61L, a portion of the insulating layer 62L, and a portion of the insulating layer 63L by RIE. The semiconductor layers of the first conductivity type are exposed via the openings. A metal layer 50L is formed on the insulating layer 63L. The openings are filled with the metal layer 50L. For example, the metal layer 50L includes aluminum and is formed by sputtering. As shown in FIG. 4B, multiple wiring parts are formed by patterning the metal layer 50L. Thus, the light detector according to the first embodiment is manufactured.

According to the first embodiment, the performance of the light detector 110 can be improved as follows.

In the first embodiment, the conductor 40 is conductive and is electrically connected to the conductive layer 10. For example, a portion of the first member 40a is provided between the first conductive portion 11 and the second conductive portion 12. Thereby, the potential of the conductive layer 10 can be controlled via the conductor 40. The control of the potential of the conductive layer 10 is easy. Also, by providing the first insulating part 31 and the second insulating part 32, the occurrence of the leakage current between the conductor 40 and the first element 21 and the occurrence of the leakage current between the conductor 40 and the second element 22 can be suppressed.

Or, in the first embodiment, the light transmittance of the first member 40a is lower than the light transmittance of the third semiconductor layer 21c and lower than the light transmittance of the sixth semiconductor layer 22f. For example, the light transmittance of the first member 40a is lower than the light transmittance of the first insulating part 31 and lower than the light transmittance of the second insulating part 32. Thereby, secondary photons that are generated in one of the first element 21 or the second element 22 can be suppressed from entering the other of the first element 21 or the second element 22. As a result, the crosstalk can be reduced.

The configurations described above may be combined. Namely, in the first embodiment, the conductor 40 is conductive; the first insulating part 31 and the second insulating part 32 are provided; and the light transmittance of the first member 40a is lower than the light transmittance of the third semiconductor layer 21c and lower than the light transmittance of the sixth semiconductor layer 22f. Accordingly, the crosstalk can be reduced while making the control of the potential of the conductive layer 10 easy and suppressing the occurrence of the leakage current.

Second Embodiment

Figure 5A:
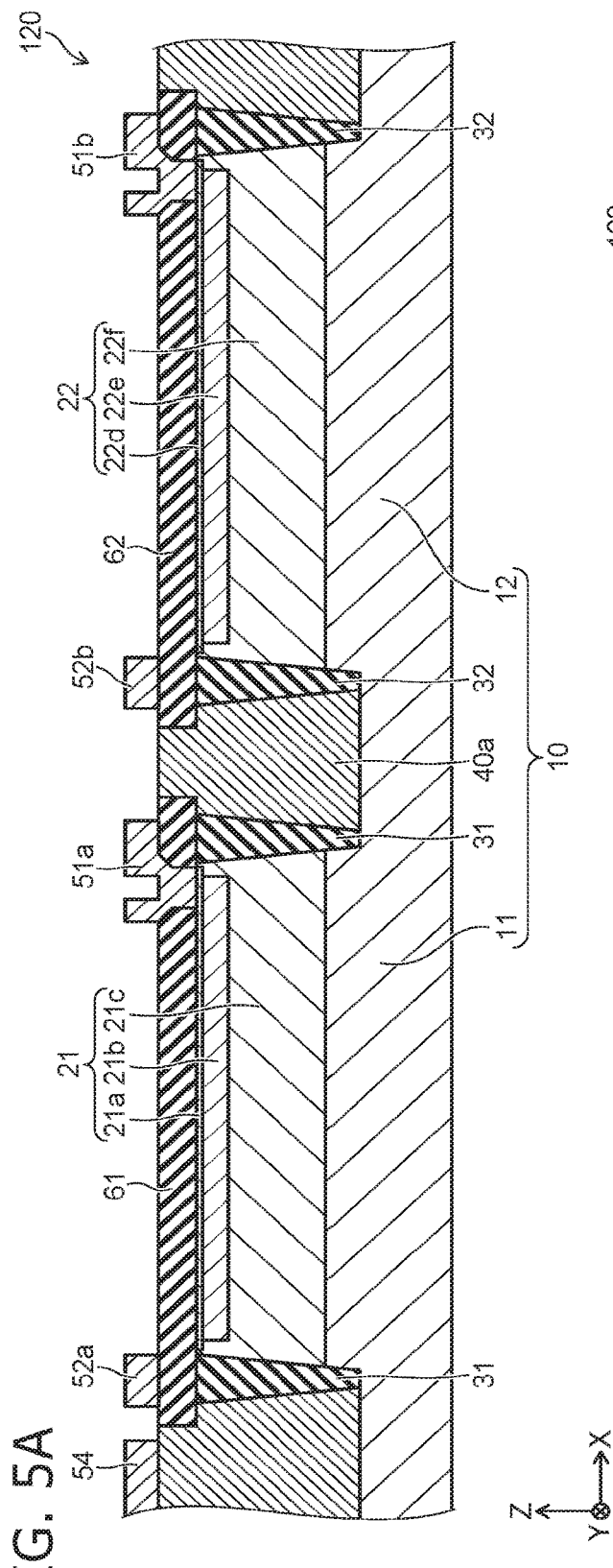
FIG. 5A and FIG. 5B are schematic cross-sectional views illustrating a light detector according to a second embodiment.
Figure 5B:
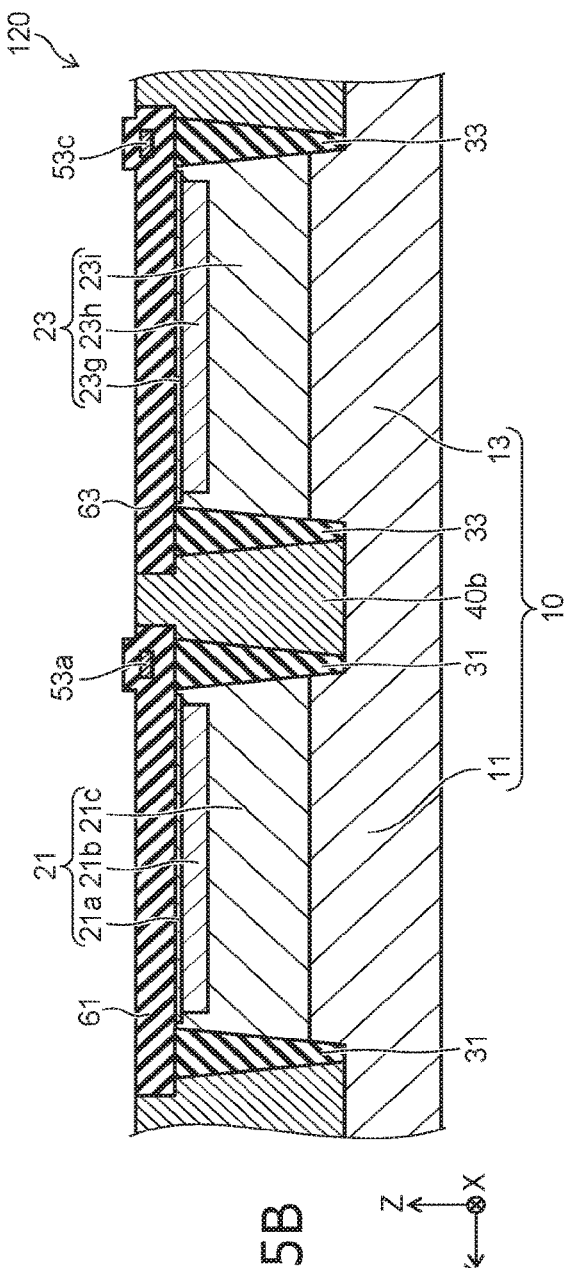

FIG. 5A and FIG. 5B are schematic cross-sectional views illustrating a light detector according to a second embodiment.

In the light detector 120 according to the second embodiment shown in FIG. 5A and FIG. 5B, the first insulating part 31 and the second insulating part 32 contact the first member 40a of the conductor 40. The first insulating part 31 and the third insulating part 33 contact the second member 40b of the conductor 40.

Or, one of the semiconductor part 25a or 25b may be provided between the first insulating part 31 and the first member 40a or between the second insulating part 32 and the first member 40a. One of the semiconductor part 25a or 25c may be provided between the first insulating part 31 and the second member 40b or between the third insulating part 33 and the second member 40b.

In the light detector 120, compared to the light detector 110, the length in the X-direction of the first member 40a is long; and the length in the Y-direction of the second member 40b is long. According to the second embodiment, the following effects are obtained in addition to the effects of the first embodiment.

When the conductor 40 is conductive, the electrical resistance of the conductor 40 can be reduced. Thereby, the fluctuation of the potential of the conductive layer 10 can be suppressed when controlling the potential of the conductive layer 10 via the conductor 40. Or, when the light transmittance of the conductor 40 is lower than the light transmittances of the semiconductor layers, the secondary photons do not pass through the conductor 40 easily. The crosstalk can be reduced thereby.

According to the second embodiment, compared to the first embodiment, the width of the trench formed between the insulating layers 31L and 32L can be wide when forming the metal layer 40L shown in FIG. 3B and FIG. 4A. In other words, compared to the first embodiment, the ratio of the width of the trench to the depth of the trench is large. Thereby, it is easy to form the trench and the metal layer 40L. As a result, for example, the yield of the light detector 120 can be increased.

Third Embodiment

Figure 6:
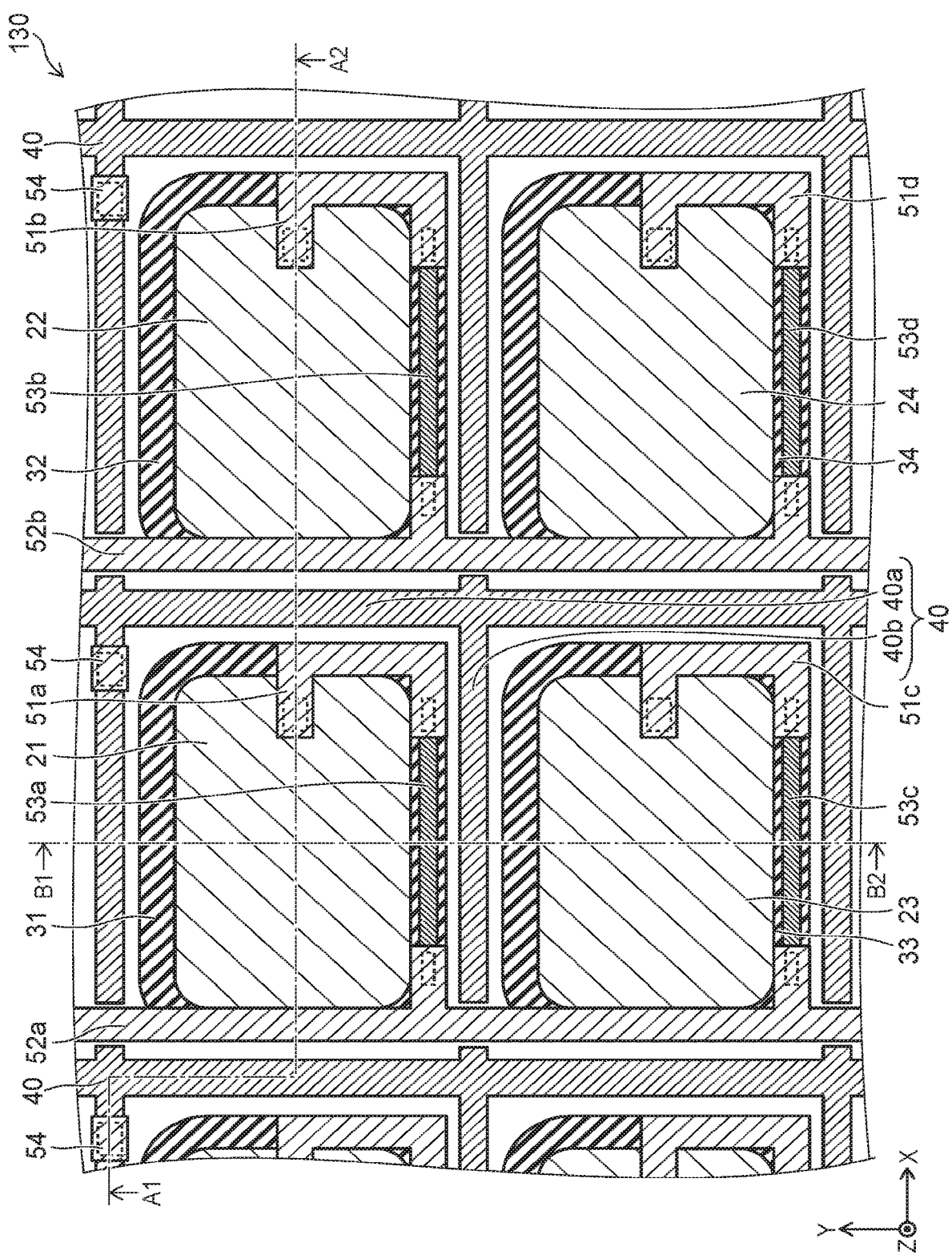
FIG. 6 is a schematic plan view illustrating a light detector according to a third embodiment.

FIG. 6 is a schematic plan view illustrating a light detector according to a third embodiment.

In the light detector 130 according to the third embodiment shown in FIG. 6, the first connection wiring part 52a and the second connection wiring part 52b do not overlap the conductor 40 in the Z-direction.

For example, multiple conductors 40 are provided in the X-direction. When viewed from the Z-direction, the first connection wiring part 52a is positioned between one of the multiple conductors 40 and another one of the multiple conductors 40 in the X-direction. When viewed from the Z-direction, the second connection wiring part 52b is positioned between the other one of the multiple conductors 40 and yet another one of the multiple conductors 40 in the X-direction.

According to the light detector 130, the parasitic capacitance that occurs between the connection wiring part and the conductor 40 can be reduced. Therefore, according to the third embodiment, the following effects are obtained in addition to the effects of the first embodiment or the second embodiment. For example, the sensitivity when each element detects the light can be increased. Also, the effects on the time constant of the output pulse due to the parasitic capacitance can be reduced; and the crosstalk due to the parasitic capacitance can be suppressed.

Fourth Embodiment

Figure 7:
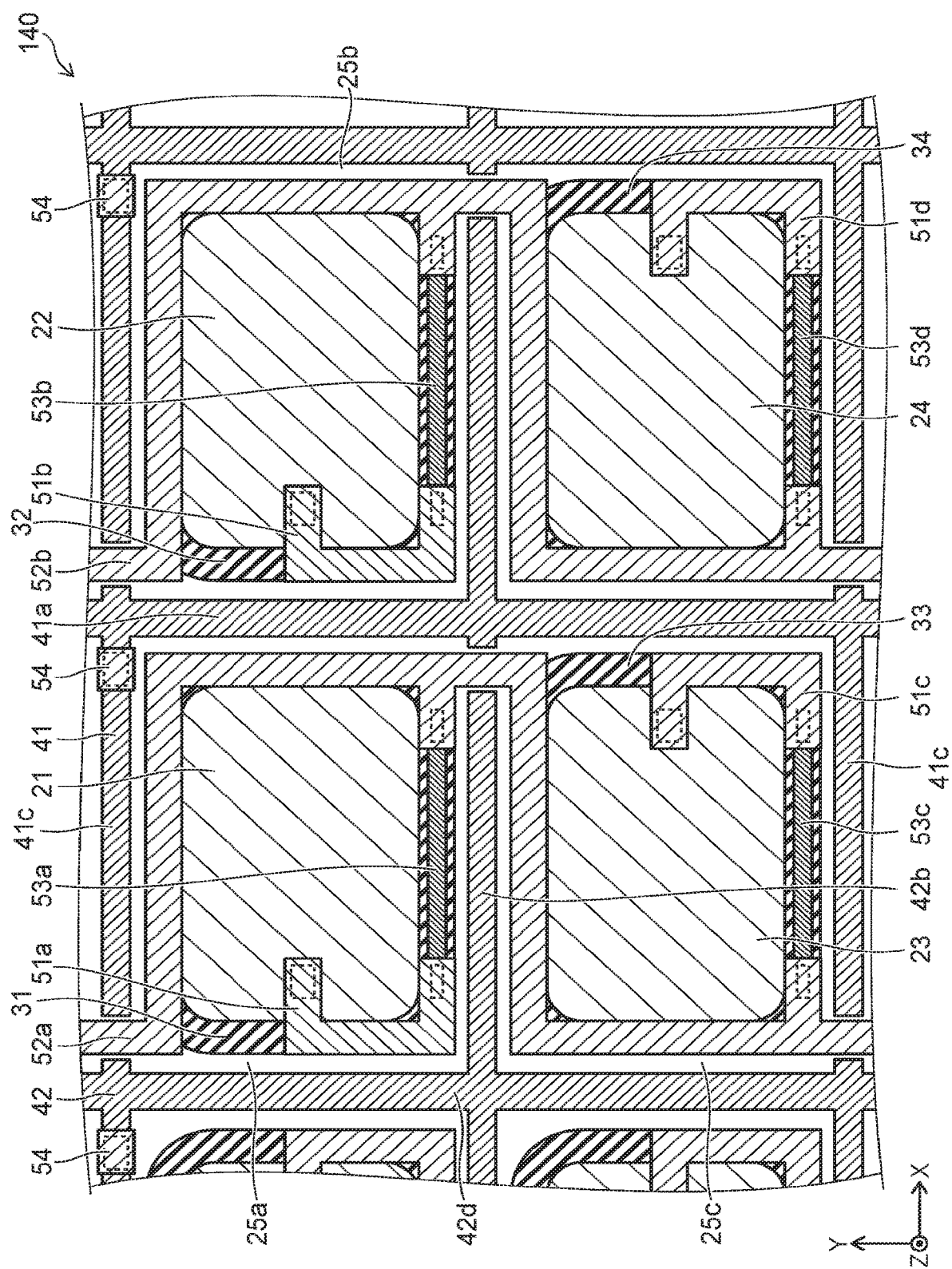
FIG. 7 is a schematic plan view illustrating a light detector according to a fourth embodiment.

FIG. 7 is a schematic plan view illustrating a light detector according to a fourth embodiment.

The light detector 140 according to the fourth embodiment shown in FIG. 7 includes a first member 41 and a second member 42.

The first member 41 includes a first region 41a provided between the first element 21 and the second element 22 and between the third element 23 and the fourth element 24 in the X-direction. The first member 41 further includes multiple third regions 41c. One end in the X-direction of each third region 41c is connected to the first region 41a.

The second member 42 includes a second region 42b provided between the first element 21 and the third element 23 in the Y-direction. The second region 42b is positioned between the third regions 41c in the Y-direction. The first element 21 is positioned between the second region 42b and one of the multiple third regions 41c. The third element 23 is positioned between the second region 42b and another one of the multiple third regions 41c.

The second member 42 further includes a fourth region 42d. One end in the X-direction of the second region 42b is connected to the fourth region 42d. The first element 21 and the third element 23 are positioned between the first region 41a and the fourth region 42d in the X-direction.

For example, the first member 41 and the second member 42 are conductive and are electrically connected to the conductive layer 10. For example, the first member 41 and the second member 42 include tungsten.

The first member 41 and the second member 42 are separated from each other. Thereby, the semiconductor part 25a and the semiconductor part 25c are linked between the first region 41a and the other end of the second region 42b. The multiple wiring parts 54 are electrically connected respectively to the first member 41 and the second member 42.

The first connection wiring part 52a does not overlap the first member 41 or the second member 42 in the Z-direction. In other words, when viewed from the Z-direction, the position of the first connection wiring part 52a is different from the position of the first member 41 and the position of the second member 42. The position in the X-direction and the position in the Y-direction of each portion of the first connection wiring part 52a are different from the position in the X-direction and the position in the Y-direction of the first member 41. Also, the position in the X-direction and the position in the Y-direction of each portion of the first connection wiring part 52a are different from the position in the X-direction and the position in the Y-direction of the second member 42. For example, when viewed from the Z-direction, portions of the first connection wiring part 52a are positioned between the fourth region 42d and the third regions 41c. When viewed from the Z-direction, another portion of the first connection wiring part 52a is positioned between the first region 41a and the second region 42b. The parasitic capacitance between the first connection wiring part 52a and the first member 41 and the parasitic capacitance between the first connection wiring part 52a and the second member 42 can be reduced thereby.

For example, the light transmittances of the first member 41 and the second member 42 each are lower than the light transmittances of the third semiconductor layer 21c, the sixth semiconductor layer 22f, and the ninth semiconductor layer 23i. As shown in FIG. 7, the position in the X-direction of the gap between the first region 41a and the second region 42b is different from the position in the X-direction of the gap between the third region 41c and the fourth region 42d. According to the fourth embodiment, in addition to the effects of at least one of the first to third embodiments, the secondary photons that are generated in one element can be suppressed from entering an adjacent element. As a result, the crosstalk can be reduced further.

Fifth Embodiment

Figure 8:
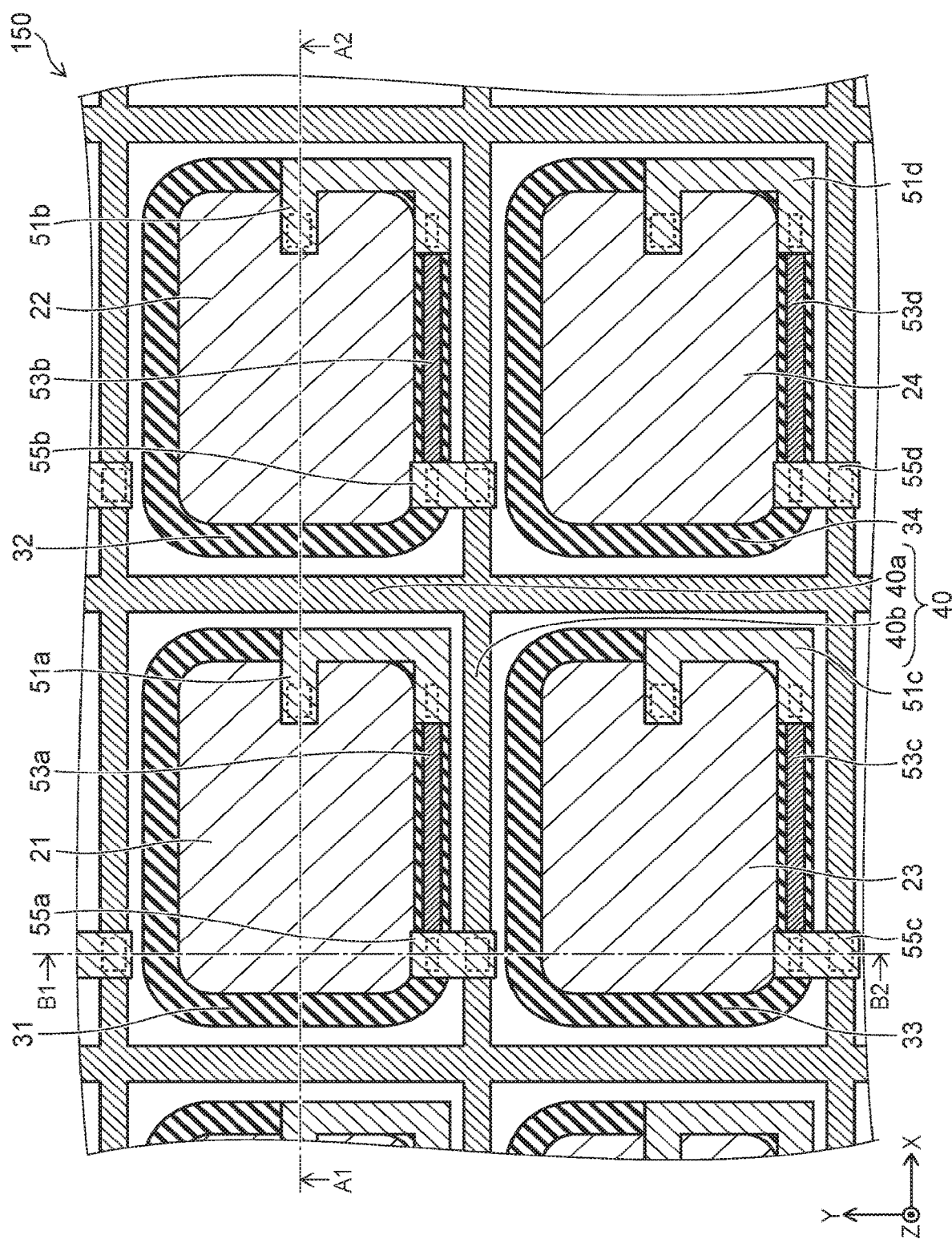
FIG. 8 is a schematic plan view illustrating a light detector according to a fifth embodiment.

FIG. 8 is a schematic plan view illustrating a light detector according to a fifth embodiment.

Figure 9A:
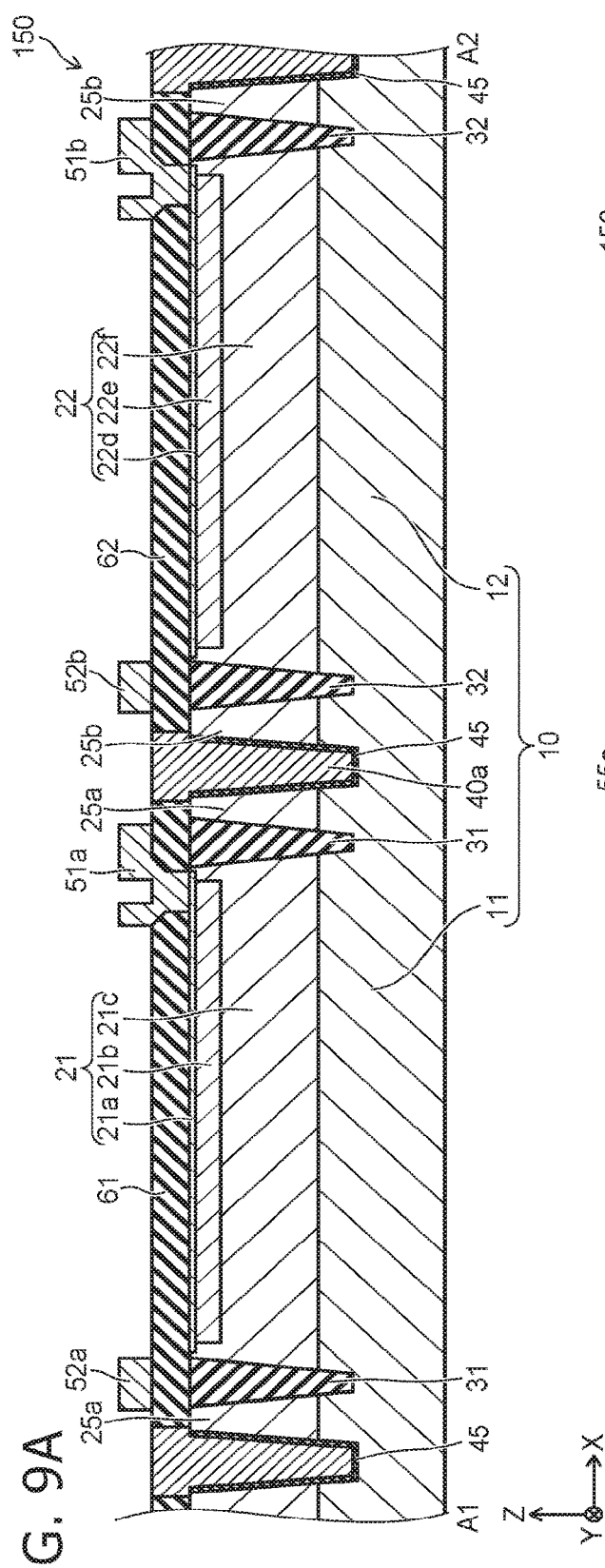
FIG. 9A and FIG. 9B are schematic cross-sectional views illustrating the light detector according to the fifth embodiment.
Figure 9B:
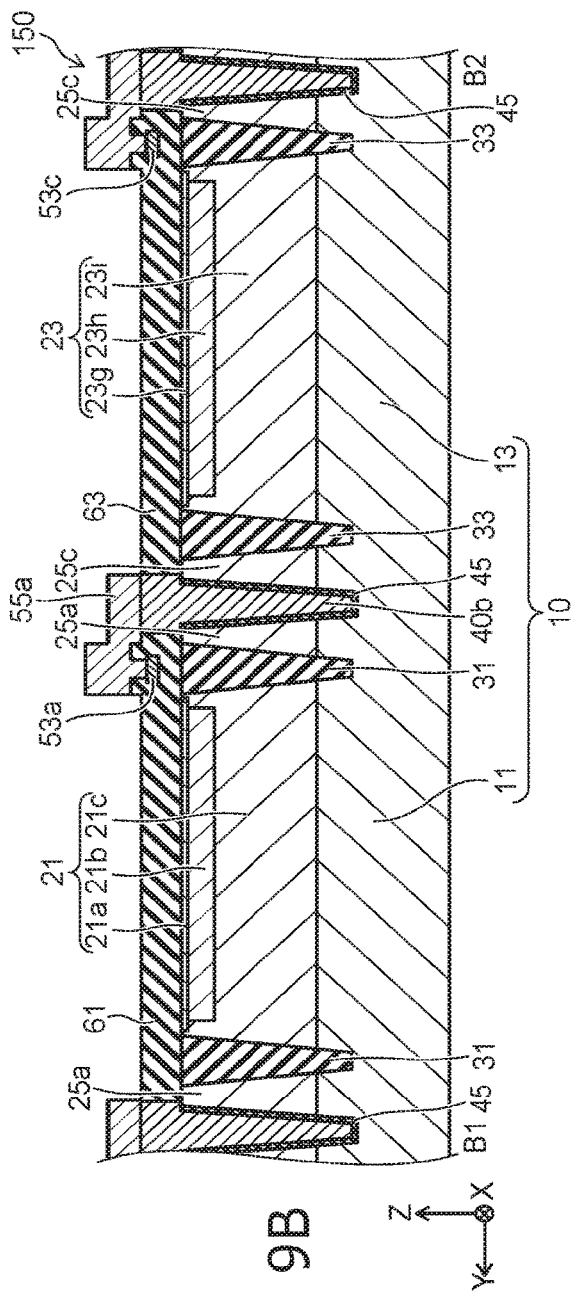

FIG. 9A and FIG. 9B are schematic cross-sectional views illustrating the light detector according to the fifth embodiment.

FIG. 9A is an A1-A2 cross section of FIG. 8. FIG. 9B is a B1-B2 cross section of FIG. 8.

The light detector 150 shown in FIG. 8, FIG. 9A, and FIG. 9B includes an insulating layer 45 and first to fourth connection parts 55a to 55d.

The conductor 40 is conductive in the light detector 150 according to the fifth embodiment. As shown in FIG. 8, the first to fourth connection parts 55a to 55d are electrically connected to the conductor 40. The first to fourth wiring parts 51a to 51d are electrically connected respectively to the first to fourth connection parts 55a to 55d via the first to fourth conductive parts 53a to 53d.

As shown in FIG. 9A and FIG. 9B, the insulating layer 45 is provided between the conductor 40 and the conductive layer 10. The conductor 40 is electrically isolated from the conductive layer 10 by the insulating layer 45.

For example, the insulating layer 45 includes at least one selected from the group consisting of silicon, oxygen, and nitrogen. For example, the first to fourth connection parts 55a to 55d include at least one selected from the group consisting of aluminum, tungsten, copper, and titanium.

The conductor 40 is used as wiring in the light detector 150. According to the fifth embodiment, in addition to the effects of at least one of the first to fourth embodiments, the amount of wiring provided on each element can be reduced. As a result, for example, the light detector can be downsized.

Sixth Embodiment

FIG. 10A and FIG. 10B are schematic cross-sectional views illustrating a light detector according to a sixth embodiment.

In the light detector 160 according to the sixth embodiment shown in FIG. 10A and FIG. 10B, the first member 40a contacts the first insulating part 31 and the second insulating part 32. The second member 40b contacts the first insulating part 31 and the third insulating part 33.

Or, a semiconductor part 25 may be provided between the first insulating part 31 and the first member 40a or between the second insulating part 32 and the first member 40a. The semiconductor part 25 may be provided between the first insulating part 31 and the second member 40b or between the third insulating part 33 and the second member 40b.

In the light detector 160, compared to the light detector 120, the length in the X-direction of the first member 40a is long; and the length in the Y-direction of the second member 40b is long. According to the sixth embodiment, the following effects are obtained in addition to the effects of at least one of the first to fifth embodiments.

When the conductor 40 is conductive, the electrical resistance of the conductor 40 can be reduced. Or, when the light transmittance of the conductor 40 is lower than the light transmittances of the semiconductor layers, the secondary photons do not pass through the conductor 40 easily. The crosstalk can be reduced thereby.

Seventh Embodiment

Figure 11A:
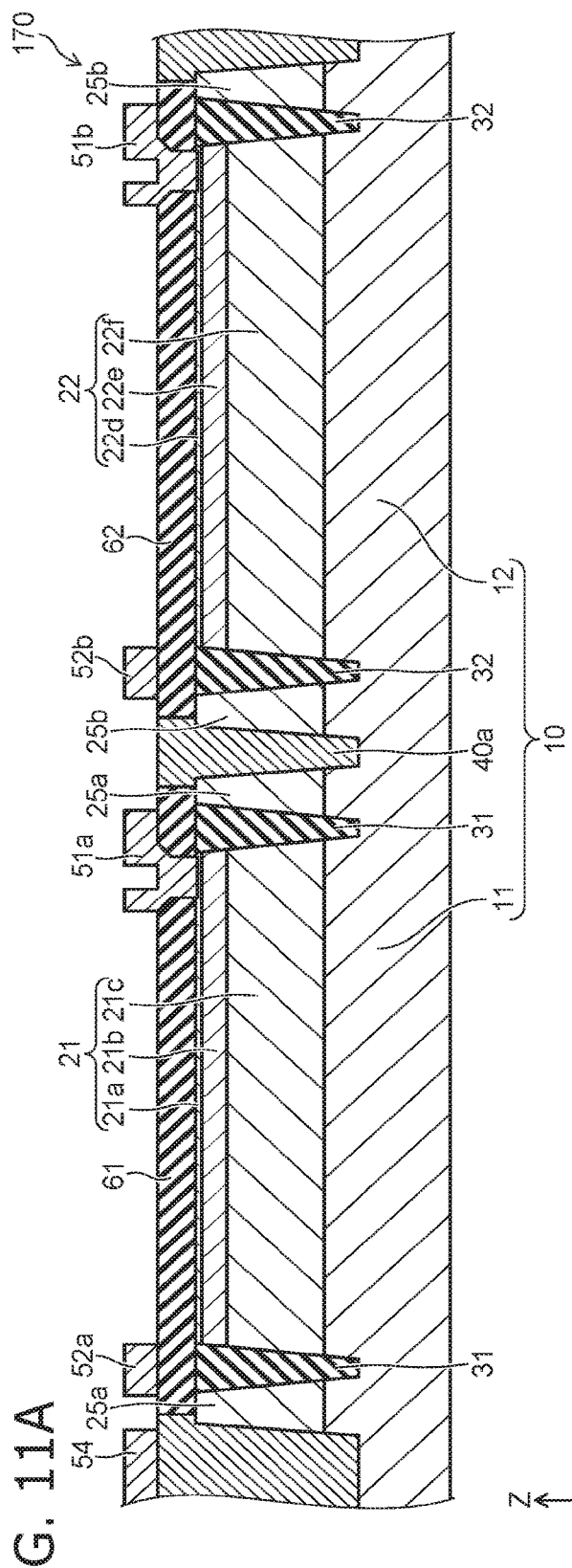
FIG. 11A and FIG. 11B are schematic cross-sectional views illustrating a light detector according to a seventh embodiment.
Figure 11B:
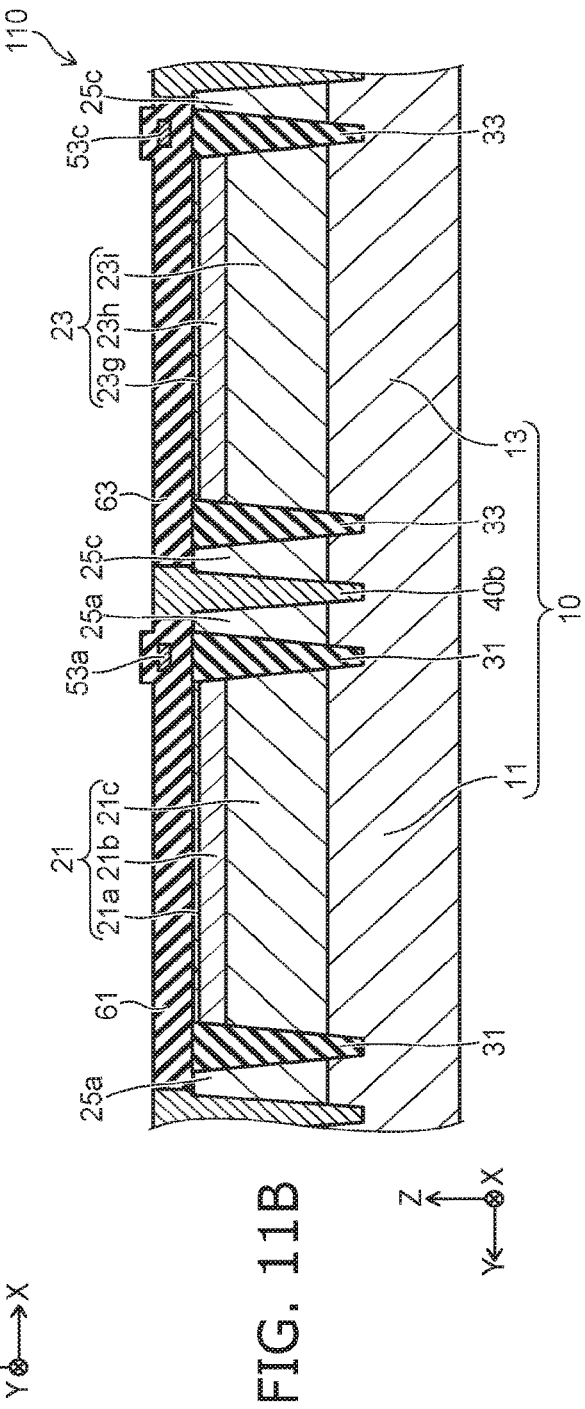

FIG. 11A and FIG. 11B are schematic cross-sectional views illustrating a light detector according to a seventh embodiment.

In the light detector 170 according to the seventh embodiment shown in FIG. 11A and FIG. 11B, the first semiconductor layer 21a and the second semiconductor layer 21b contact the first insulating part 31. The fourth semiconductor layer 22d and the fifth semiconductor layer 22e contact the second insulating part 32. The seventh semiconductor layer 23g and the eighth semiconductor layer 23h contact the third insulating part 33. Other than the points where the first to third insulating parts 31 to 33 contact the semiconductor layers, the configuration of the light detector 170 is, for example, similar to that of the light detector 110.

According to the seventh embodiment, similarly to the first embodiment, the potential of the conductive layer 10 is controllable via the conductor 40 if the conductor 40 is conductive. Also, the occurrence of the leakage current between the conductor 40 and the first element 21 and the occurrence of the leakage current between the conductor 40 and the second element 22 can be suppressed by the first insulating part 31 and the second insulating part 32. Or, the crosstalk can be reduced when the light transmittance of the first member 40a is lower than the light transmittance of the third semiconductor layer 21c and lower than the light transmittance of the sixth semiconductor layer 22f.

The semiconductor layers similarly may contact the first to third insulating parts 31 to 33 in the light detectors according to any of the second to sixth embodiments.

Eighth Embodiment

Figure 12:
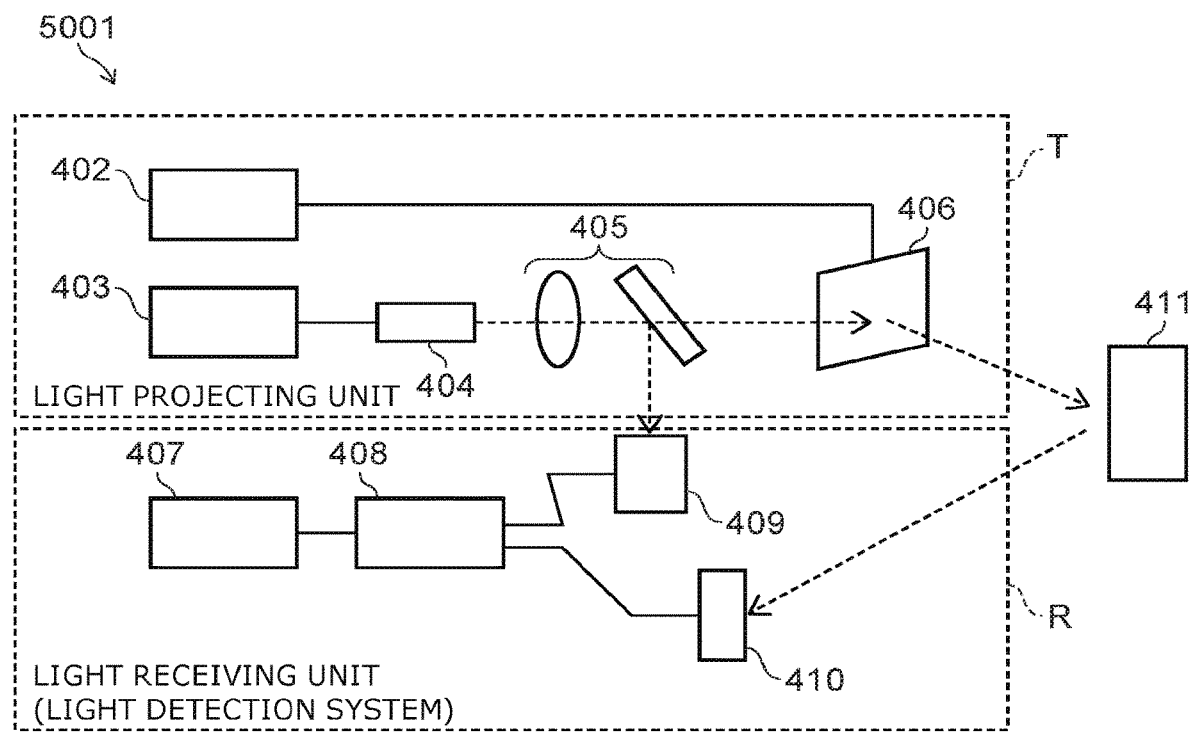
FIG. 12 is a schematic view illustrating a lidar (Laser Imaging Detection and Ranging) device according to an eighth embodiment.

FIG. 12 is a schematic view illustrating a lidar (Laser Imaging Detection and Ranging) device according to an eighth embodiment.

The embodiment is applicable to a long-distance subject detection system (LIDAR) or the like including a line light source and a lens. The lidar device 5001 includes a light projecting unit T projecting laser light toward an object 411, and a light receiving unit R (also called a light detection system) receiving the laser light from the object 411, measuring the time of the round trip of the laser light to and from the object 411, and converting the time into a distance.

In the light projecting unit T, a laser light oscillator (also called a light source) 404 produces laser light. A drive circuit 403 drives the laser light oscillator 404. An optical system 405 extracts a portion of the laser light as reference light, and irradiates the rest of the laser light on the object 411 via a mirror 406. A mirror controller 402 projects the laser light onto the object 411 by controlling the mirror 406. Herein, "project" means to cause the light to strike.

In the light receiving unit R, a reference light detector 409 detects the reference light extracted by the optical system 405. A light detector 410 receives the reflected light from the object 411. Based on the reference light detected by the reference light detector 409 and the reflected light detected by the light detector 410, a distance measuring circuit 408 measures the distance to the object 411. An image recognition system 407 recognizes the object 411 based on the results measured by the distance measuring circuit 408.

The lidar device 5001 employs light time-of-flight ranging in which the time of the round trip of the laser light to and from the object 411 is measured and converted into a distance. The lidar device 5001 is applied to an automotive drive-assist system, remote sensing, etc. Good sensitivity is obtained particularly in the near-infrared region when the light detectors of the embodiments described above are used as the light detector 410. Therefore, the lidar device 5001 is applicable to a light source of a wavelength band invisible to humans. For example, the lidar device 5001 can be used for obstacle detection in a vehicle.

Figure 13:
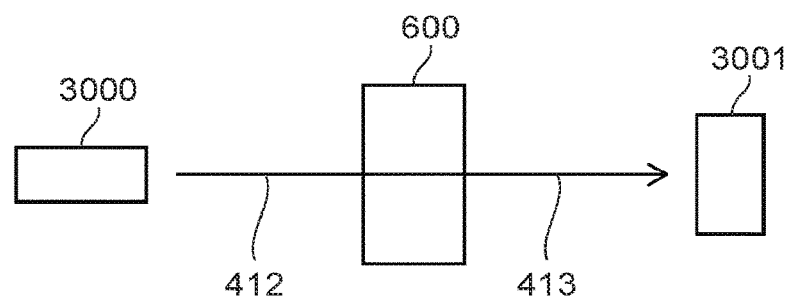
FIG. 13 is a drawing for describing the detection of the detection object of the lidar device.

FIG. 13 is a drawing for describing the detection of the detection object of the lidar device.

A light source 3000 emits light 412 toward an object 600 which is the detection object. A light detector 3001 detects light 413 which passes through the object 600, is reflected by the object 600, or is diffused by the object 600.

For example, the light detector 3001 realizes a highly-sensitive detection when the light detector according to the embodiment described above is used. It is favorable to provide multiple sets of the light detector 410 and the light source 404 and to preset the arrangement relationship in the software (which is replaceable with a circuit). For example, it is favorable for the arrangement relationship of the sets of the light detector 410 and the light source 404 to be at uniform spacing. Thereby, an accurate three-dimensional image can be generated by the output signals of each light detector 410 supplementing each other.

Figure 14:
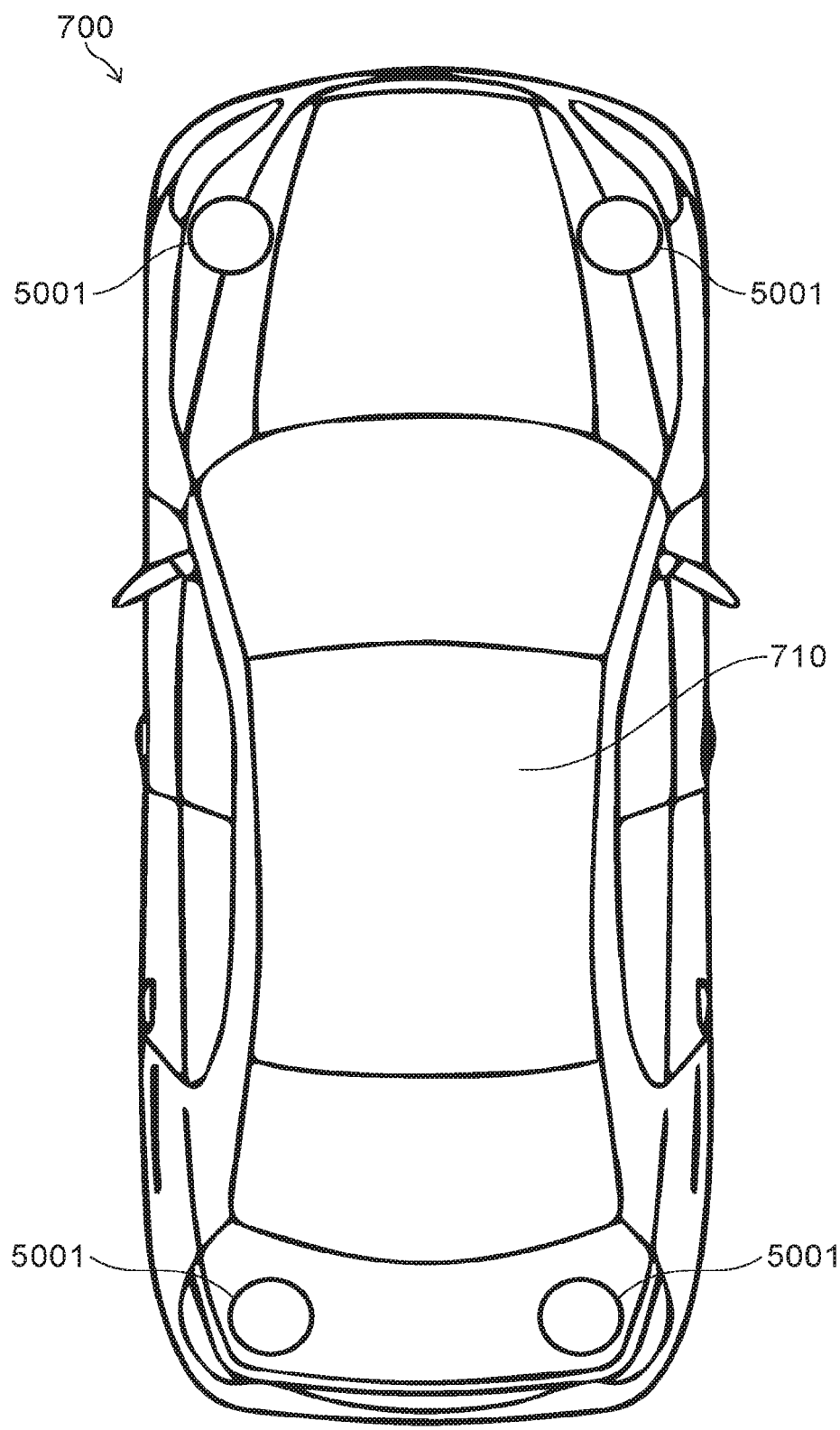
FIG. 14 is a schematic top view of a vehicle including the lidar device according to the eighth embodiment.

FIG. 14 is a schematic top view of a vehicle including the lidar device according to the eighth embodiment.

A vehicle 700 according to the embodiment includes the lidar devices 5001 at four corners of a vehicle body 710. Because the vehicle according to the embodiment includes the lidar devices at the four corners of the vehicle body, the environment in all directions of the vehicle can be detected by the lidar devices.

According to the embodiments described above, a light detector can be provided in which the performance is improved.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in the light detector such as the conductive layer, the element, the insulating part, the first member, the wiring part, the connection wiring part, the conductive part, the connection part, the insulating region, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all light detector, all light detection systems, all lidar devices, and all vehicles practicable by an appropriate design modification by one skilled in the art based on the light detector, the light detection system, the lidar device, and the vehicle described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A light detector, comprising:
a conductive layer including a first conductive portion and a second conductive portion;
a first element including a first semiconductor layer and a second semiconductor layer, the first semiconductor layer being of a first conductivity type, the second semiconductor layer being of a second conductivity type and being provided between the first conductive portion and the first semiconductor layer in a second direction crossing a first direction, the first direction being from the first conductive portion toward the second conductive portion;
a second element including a fourth semiconductor layer and a fifth semiconductor layer, the fourth semiconductor layer being of the first conductivity type, the fifth semiconductor layer being of the second conductivity type and being provided between the second conductive portion and the fourth semiconductor layer in the second direction;
a first member provided between the first element and the second element and electrically connected to the conductive layer, the first member being conductive;
a first insulating part provided between the first element and the first member;
a second insulating part provided between the second element and the first member; and
a first wiring part electrically connected to the first semiconductor layer, a portion of the first element and a portion of the first insulating part being positioned between the conductive layer and the first wiring part in the second direction.

2. The detector according to claim 1, wherein the first member contacts the conductive layer.

3. The detector according to claim 1, further comprising:
a first connection wiring part; and
a first conductive part connected between the first wiring part and the first connection wiring part,
an electrical resistance of the first conductive part being higher than an electrical resistance of the first wiring part and higher than an electrical resistance of the first connection wiring part,
a position of the first connection wiring part being different from a position of the first member when viewed from the second direction.

4. The detector according to claim 1, wherein
the first element further includes a third semiconductor layer provided between the first conductive portion and the second semiconductor layer, the third semiconductor layer being of the second conductivity type, and
the second element further includes a sixth semiconductor layer provided between the second conductive portion and the fifth semiconductor layer, the sixth semiconductor layer being of the second conductivity type.

5. The detector according to claim 1, wherein at least one of the first insulating part or the second insulating part contacts the first member.

6. The detector according to claim 1, wherein a distance in the first direction between the first insulating part and the second insulating part is not less than 0.5 μm and not more than 10 μm.

7. The detector according to claim 1, wherein the first member includes at least one selected from the group consisting of tungsten, aluminum, and an alloy, the alloy including aluminum and copper.

8. A light detection system, comprising:
the light detector according to claim 1, and
a distance measuring circuit calculating, from an output signal of the light detector, a time-of-flight of light.

9. A lidar device, comprising:
a light source irradiating light on an object; and
the light detection system according to claim 8 detecting light reflected by the object.

10. The lidar device according to claim 9, further comprising an image recognition system generating a three-dimensional image based on an arrangement relationship of the light source and the light detector.

11. A vehicle, comprising the lidar device according to claim 9.

12. A vehicle, comprising the lidar devices according to claim 9 at four corners of a vehicle body.

13. The detector according to claim 1, further comprising:
a first connection wiring part; and
a first conductive part connected between the first wiring part and the first connection wiring part,
an electrical resistance of the first conductive part being higher than an electrical resistance of the first wiring part and higher than an electrical resistance of the first connection wiring part,
the first conductive part overlapping the first insulating part in the second direction.

14. A light detector, comprising:
a conductive layer including a first conductive portion and a second conductive portion;
a first element including a first semiconductor layer, a second semiconductor layer, and a third semiconductor layer, the first semiconductor layer being of a first conductivity type, the second semiconductor layer and the third semiconductor layer being of a second conductivity type, the second semiconductor layer being provided between the first conductive portion and the first semiconductor layer in a second direction crossing a first direction, the third semiconductor layer being provided between the first conductive portion and the second semiconductor layer, the first direction being from the first conductive portion toward the second conductive portion;
a second element including a fourth semiconductor layer, a fifth semiconductor layer, and a sixth semiconductor layer, the fourth semiconductor layer being of the first conductivity type, the fifth semiconductor layer and the sixth semiconductor layer being of the second conductivity type, the fifth semiconductor layer being provided between the second conductive portion and the fourth semiconductor layer in the second direction, the sixth semiconductor layer being provided between the second conductive portion and the fifth semiconductor layer;
a first insulating part provided between the first element and the second element;
a second insulating part provided between the first insulating part and the second element;
a first member provided between the first insulating part and the second insulating part, a light transmittance of the first member being lower than a light transmittance of the third semiconductor layer and lower than a light transmittance of the sixth semiconductor layer; and
a first wiring part electrically connected to the first semiconductor layer, a portion of the first element and a portion of the first insulating part being positioned between the conductive layer and the first wiring part in the second direction.

15. The detector according to claim 14, wherein
an impurity concentration of the second conductivity type in the third semiconductor layer is lower than an impurity concentration of the second conductivity type in the second semiconductor layer, and
an impurity concentration of the second conductivity type in the sixth semiconductor layer is lower than an impurity concentration of the second conductivity type in the fifth semiconductor layer.

16. The detector according to claim 14, wherein
a length L1 in the second direction of each of the first insulating part and the second insulating part, a thickness T1 in the second direction of the first semiconductor layer, a thickness T2 in the second direction of the second semiconductor layer, and a thickness T3 in the second direction of the third semiconductor layer satisfy $$T1+1.1 \times T2 < L1 \quad (1)$$

$$L1 < T1+T2+1.1 \times T3 \quad (2)$$

when the thickness T2 is not more than 10 times the thickness T3, and satisfy $$T1+1.1 \times T2 < L1 \quad (3)$$

$$T1+T2+1.1 \times T3 < L1 \quad (4)$$

when the thickness T2 is greater than 10 times the thickness T3.

17. The detector according to claim 14, wherein a length in the second direction of the first member is greater than a thickness in the second direction of the third semiconductor layer and not more than 20 µm.

18. A light detector, comprising:
a conductive layer including a first conductive portion and a second conductive portion;
a first element including a first semiconductor layer and a second semiconductor layer, the first semiconductor layer being of a first conductivity type, the second semiconductor layer being of a second conductivity type and being provided between the first conductive portion and the first semiconductor layer in a second direction crossing a first direction, the first direction being from the first conductive portion toward the second conductive portion;
a second element including a fourth semiconductor layer and a fifth semiconductor layer, the fourth semiconductor layer being of the first conductivity type, the fifth semiconductor layer being of the second conductivity type and being provided between the second conductive portion and the fourth semiconductor layer in the second direction;
a first member provided between the first element and the second element and between the first conductive portion and the second conductive portion, the first member being conductive;
an insulating layer provided between the conductive layer and the first member;
a first insulating part provided between the first element and the first member;
a second insulating part provided between the second element and the first member; and
a first wiring part electrically connected to the first semiconductor layer and the first member.

19. A light detector comprising:
a conductive layer including a first conductive portion and a second conductive portion;
a first element including a first semiconductor layer and a second semiconductor layer, the first semiconductor layer being of a first conductivity type, the second semiconductor layer being of a second conductivity type and being provided between the first conductive portion and the first semiconductor layer in a second direction crossing a first direction, the first direction being from the first conductive portion toward the second conductive portion;
a second element including a fourth semiconductor layer and a fifth semiconductor layer, the fourth semiconductor layer being of the first conductivity type, the fifth semiconductor layer being of the second conductivity type and being provided between the second conductive portion and the fourth semiconductor layer in the second direction;
a first member provided between the first element and the second element and electrically connected to the conductive layer, the first member being conductive;
a first insulating part provided between the first element and the first member;
a second insulating part provided between the second element and the first member; and
a semiconductor part provided between the first insulating part and the first member, between the second insulating part and the first member, or between the first insulating part and the first member and between the second insulating part and the first member.

* * * * *